(12) United States Patent
Yen et al.

(10) Patent No.: US 12,094,947 B2
(45) Date of Patent: Sep. 17, 2024

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Hung-Yu Yen, Taipei (TW); Ko-Feng Chen, Hsinchu (TW); Keng-Chu Lin, Ping-Tung (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 475 days.

(21) Appl. No.: 17/384,022

(22) Filed: Jul. 23, 2021

(65) Prior Publication Data

US 2023/0024022 A1    Jan. 26, 2023

(51) Int. Cl.
| | |
|---|---|
| *H01L 29/423* | (2006.01) |
| *H01L 29/06* | (2006.01) |
| *H01L 29/66* | (2006.01) |
| *H01L 29/786* | (2006.01) |

(52) U.S. Cl.
CPC .... *H01L 29/42392* (2013.01); *H01L 29/0649* (2013.01); *H01L 29/66742* (2013.01); *H01L 29/78696* (2013.01)

(58) Field of Classification Search
CPC ........... H01L 29/42392; H01L 29/0649; H01L 29/66742; H01L 29/78696
See application file for complete search history.

(56) References Cited

U.S. PATENT DOCUMENTS

| | | | | |
|---|---|---|---|---|
| 9,530,710 B2* | 12/2016 | Chen | ................. | H01L 29/66795 |
| 10,811,543 B2* | 10/2020 | Hu | ................... | H01L 29/42368 |
| 11,728,173 B2* | 8/2023 | Chen | ................. | H01L 29/78696 |
| | | | | 438/151 |
| 2003/0013271 A1* | 1/2003 | Knorr | ............... | H01L 21/76229 |
| | | | | 257/E21.548 |
| 2009/0127648 A1* | 5/2009 | Chen | ................. | H01L 21/76232 |
| | | | | 438/425 |
| 2019/0019890 A1* | 1/2019 | Ko | ..................... | H01L 29/66795 |
| 2019/0157156 A1* | 5/2019 | Chen | ................. | H01L 21/76224 |
| 2019/0385898 A1* | 12/2019 | Peng | ................ | H01L 21/02271 |

* cited by examiner

*Primary Examiner* — Kyoung Lee
*Assistant Examiner* — Sophia W Kao
(74) *Attorney, Agent, or Firm* — WPAT LAW; Anthony King

(57) ABSTRACT

A semiconductor structure includes a semiconductor substrate and an isolation structure disposed in the semiconductor substrate, wherein the isolation structure includes a first dielectric layer in contact with the semiconductor substrate and a second dielectric layer over the first dielectric layer, wherein the first dielectric layer is between the second dielectric layer and the semiconductor substrate, the first dielectric layer comprises a bottom portion and a sidewall portion, and a thickness of the bottom portion is greater than a thickness of the sidewall portion.

20 Claims, 23 Drawing Sheets

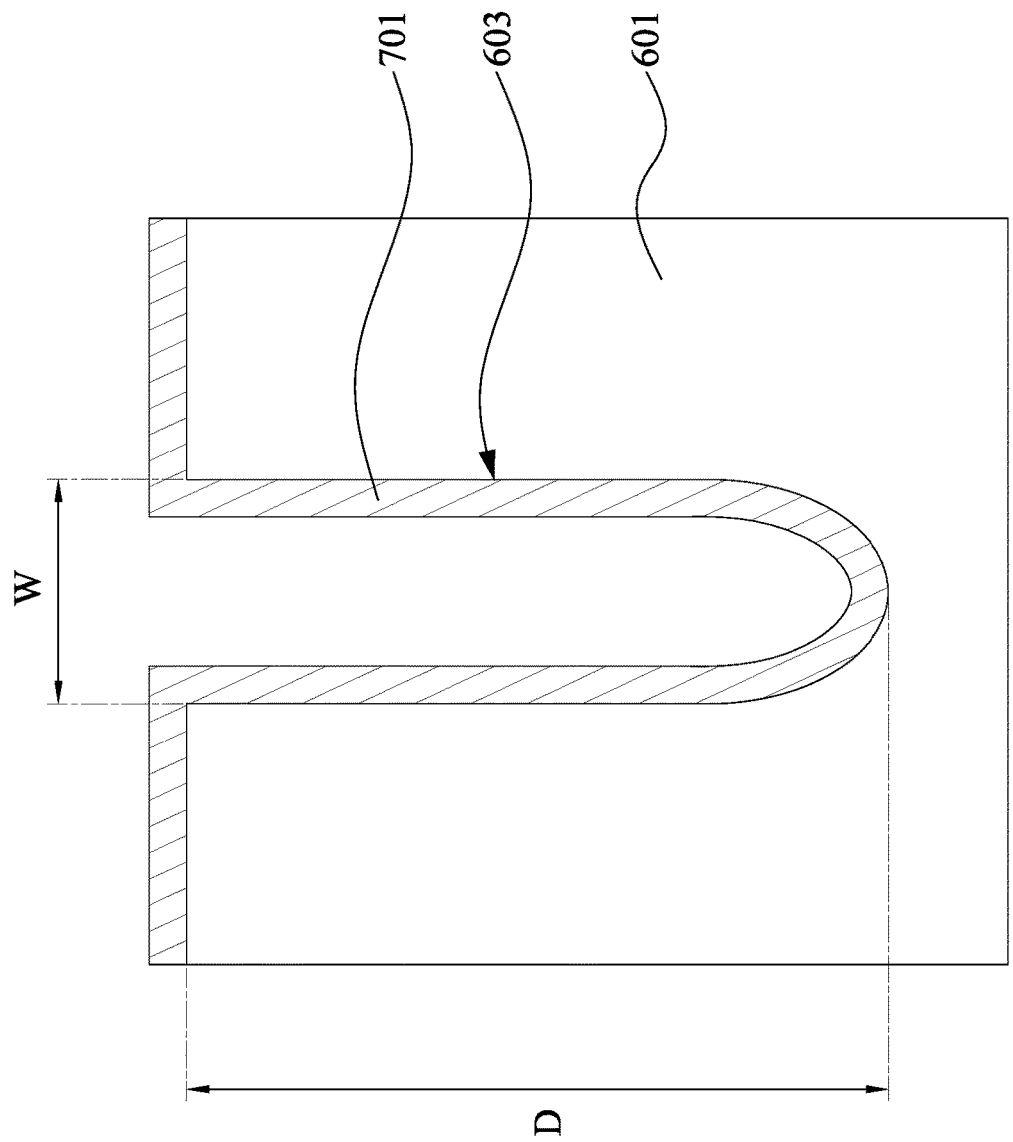

SEMICONDUCTOR STRUCTURE AND METHOD OF MANUFACTURING THE SAME

BACKGROUND

As the semiconductor industry develops smaller and smaller nanoscale products and related processes in pursuit of greater device density, higher performance, and lower costs, the challenges of downscaling both fabrication and design have led to the development of three-dimensional designs, such as multi-gate field-effect transistors (FET), including a fin FET (FinFET) and a gate-all-around (GAA) FET. In Such FETs, gate structures are electrically separated by pillar-shaped isolation structures formed by filling one or more dielectric material(s) into trenches between the gate structures. As the technology node becomes smaller, size of the isolation structures shrinks and the aspect ratio of the isolation structures becomes higher, which makes it harder to form the isolation structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A to 7D illustrate cross-sectional views of a portion of a semiconductor structure at various stage of formation in accordance with some embodiments of the present disclosure.

DETAILED DESCRIPTION

Figure 1:
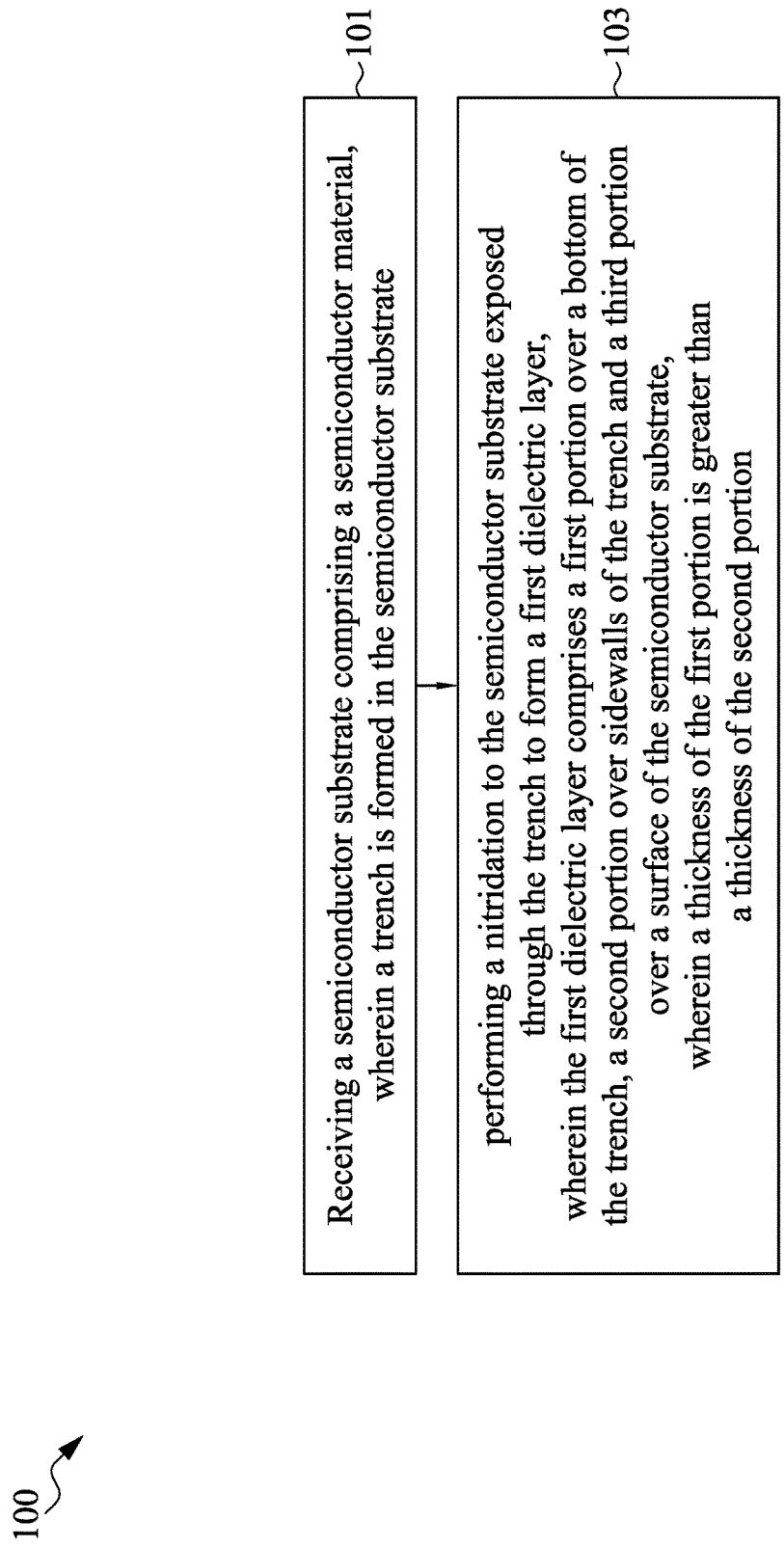
FIG. 1 illustrates a flowchart of a method for manufacturing a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

In a multi-gate field-effect transistor (FET), such as a gate-all-around (GAA) FET, gate structures are electrically separated by pillar-shaped isolation structures, which are formed by filling dielectric materials within the isolation trenches between the gate structures. The isolation structures may include an etch-stop layer (e.g., CESL) and various dielectric layers (e.g., an ILD layer). One challenge with the isolation structures is that because of the high aspect ratio of the isolation trenches, a seal at the opening of the isolation trenches or a void may be created within the isolation trenches during formation of the etch-stop layer and/or dielectric layer within the isolation trenches, which lead to undesired leakage between adjacent gate structures. Therefore, an improved method for producing isolation structures between the gate structures is needed.

Some embodiments of the present disclosure therefore provide a method for producing a semiconductor structures including isolation structures for separating the gate structures by performing nitridation with high selective formation of bottom to side-wall for forming isolation structures within isolation trenches of high aspect ratio(s).

Refer to FIG. 1. FIG. 1 illustrates a flowchart of a method 100 of forming a semiconductor structure in accordance with some embodiments of the present disclosure. The method 100 begins with operation 101 in which a semiconductor substrate including a semiconductor material is received, and wherein a trench is formed in the semiconductor substrate. In some embodiments, a trench may be formed in the semiconductor substrate.

The method 100 proceeds with operation 103 in which nitridation is performed to the semiconductor substrate exposed through the trench to form a first dielectric layer, wherein the first dielectric layer includes a first portion over a bottom of the trench, a second portion over sidewalls of the trench and a third portion over a surface of the semiconductor substrate, wherein a thickness of the first portion is greater than a thickness of the second portion. In some embodiments, nitridation may be performed by a plasma nitridation. In some embodiments, the plasma nitridation may use a plasma source such as inductively-coupled plasma (ICP), capacitively coupled plasma (CCP), microwave (MW) plasma or electron cyclotron resonance (ECR) plasma.

Figure 2:
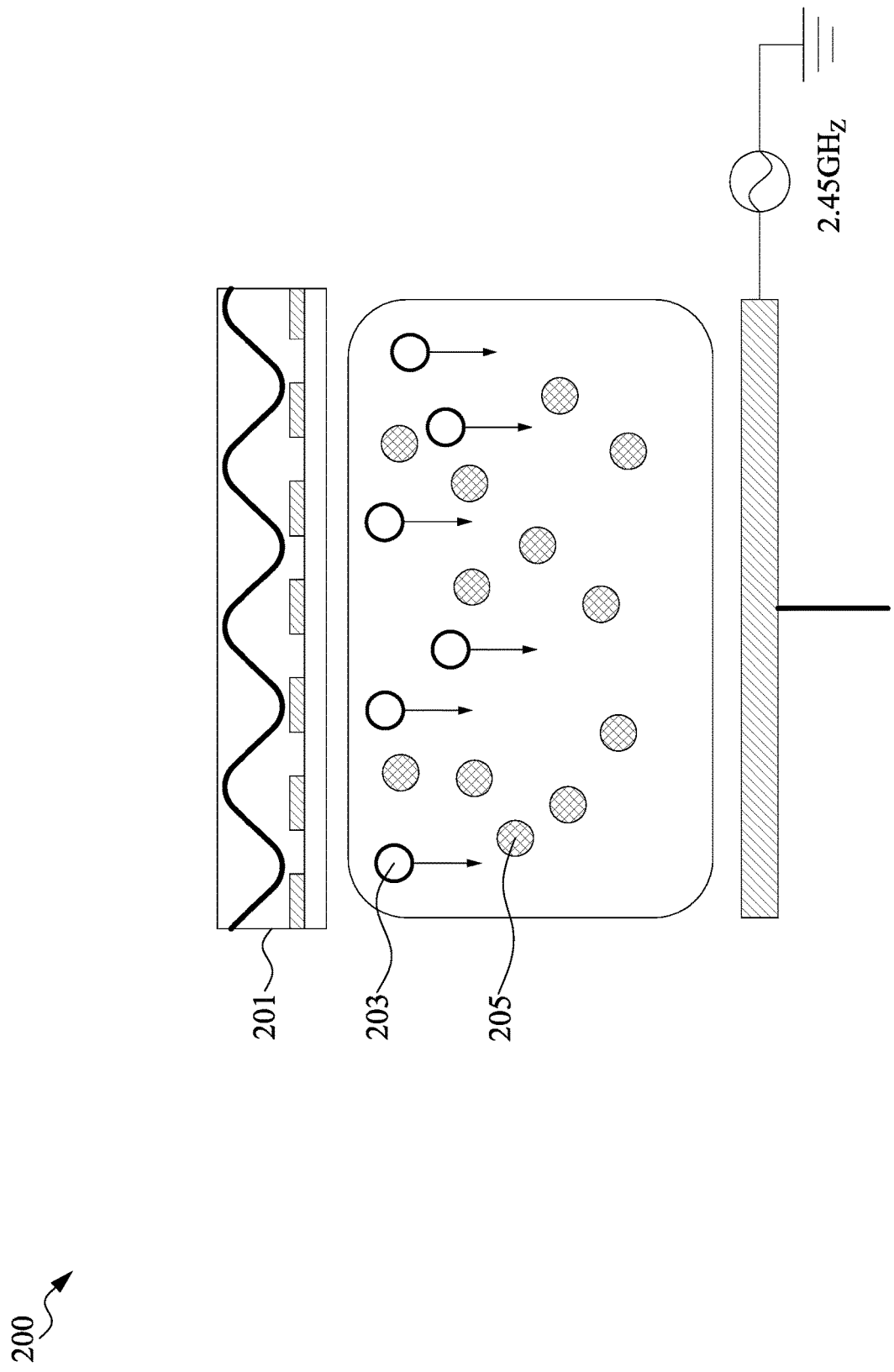
FIG. 2 illustrates a schematic view of a microwave (MW) plasma apparatus in accordance with some embodiments of the present disclosure.
Figure 3:
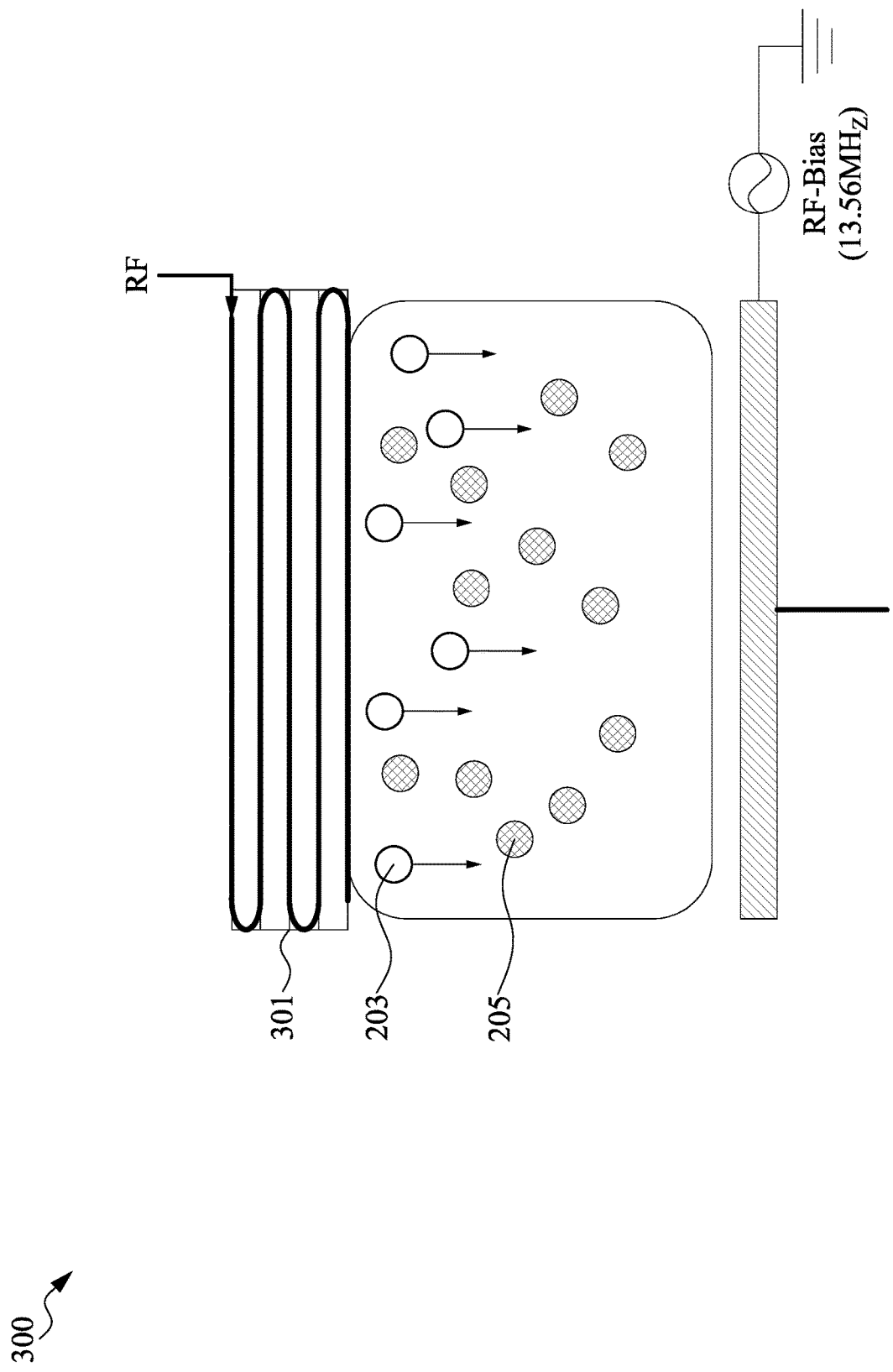
FIG. 3 illustrates a schematic view of an inductively-coupled plasma (ICP) apparatus in accordance with some embodiments of the present disclosure.

Refer to FIGS. 2 and 3. FIGS. 2 and 3 illustrate schematic views of a MW plasma apparatus 200 (FIG. 2) and ICP apparatus 300 (FIG. 3) for carrying out plasma nitridation to the semiconductor substrate. For a MW plasma apparatus 200 as shown in FIG. 2, a nitrogen source is introduced into the apparatus 200 and a microwave 201 is used to ionize nitrogen of nitrogen source in a process chamber (not shown) to produce nitrogen ions 203 and radicals 205, among which nitrogen ions 203 will be directed to the semiconductor substrate with an application of an electric field toward a direction vertical to the bottom of the trench so as to make the first dielectric layer selectively form in the first portion over the bottom of the trench more than in the second portion over sidewalls of the trench so that the thickness of the first portion is greater than the thickness of the second portion. In some embodiments, the trench may have an aspect ratio greater than 10. Therefore, a selective formation of the first dielectric layer may decrease the aspect ratio and further help reduce the formation of seal at an opening of the trench or a void in the trench.

Similar operation mode may be found in the ICP apparatus 300 as shown in FIG. 3. The difference between the operation mode of the MW plasma apparatus 200 and the ICP apparatus 300 resides in that the energy for generating the nitrogen plasma and radicals in the ICP apparatus 300 is supplied by an radio-frequency power of 30 W to 800 W at a frequency of about 13.56 MHz to the metal coils, such as copper coils, to generate electric currents which are produced by electromagnetic induction, that is, by time-varying magnetic field, while in the MW plasma apparatus, the energy is supplied by the microwave. In some embodiments, the RF bias power applied for selective formation of the first dielectric layer may be in the range of from 30 W to 800 W. In some embodiments, the nitridation may be performed using a nitrogen source plasma such as a $N_2$ plasma, a $N_2$ radical ($N^*$, $N_2^*$), a $NH_3$ plasma, or a $NH_3$ radical ($NH_3^*$, $NH_2^*$, or $NH^*$).

Figure 4:
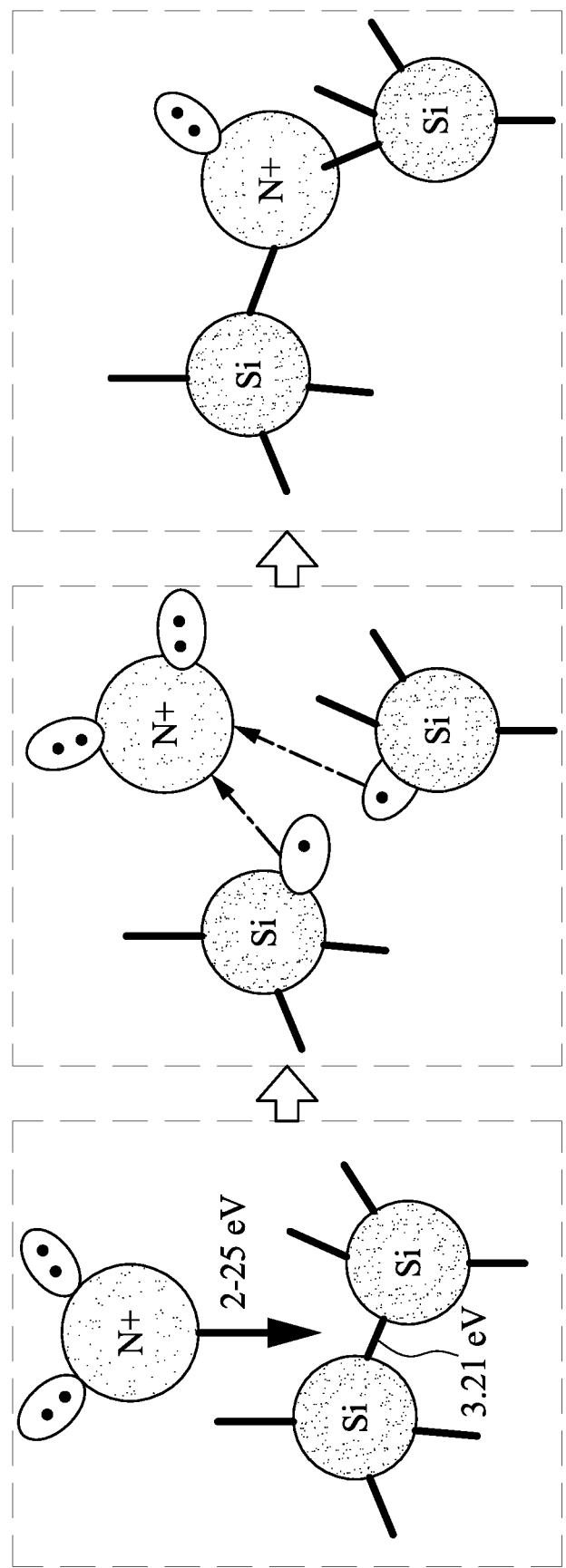
FIG. 4 illustrates a schematic view of the "nitridation" operation in accordance with some embodiments of the present disclosure.

Refer to FIG. 4. FIG. 4 illustrates a schematic view of the "nitridation" operation in accordance with some embodiments of the present disclosure. In some embodiments, the term "nitridation" refers to the reformation of the semiconductor material, such as silicon, into a nitride dielectric material, such as silicon nitride. As shown in FIG. 4, in the case where the semiconductor material is silicon, the nitrogen plasma comes into contact with silicon, and break the bond linking two silicon atoms and instead forming silicon nitride by creating a Si—N linkage between the nitrogen atoms and the silicon atoms.

In some embodiments, the pressure for carrying out the nitridation process may be less than 0.5 torr. In some embodiments, when the pressure is 0.5 torr or higher, the nitrogen ions formed in the plasma apparatus may be less than the nitrogen radicals formed in the plasma apparatus, and thus the nitridation rate may be slower.

Figure 5:
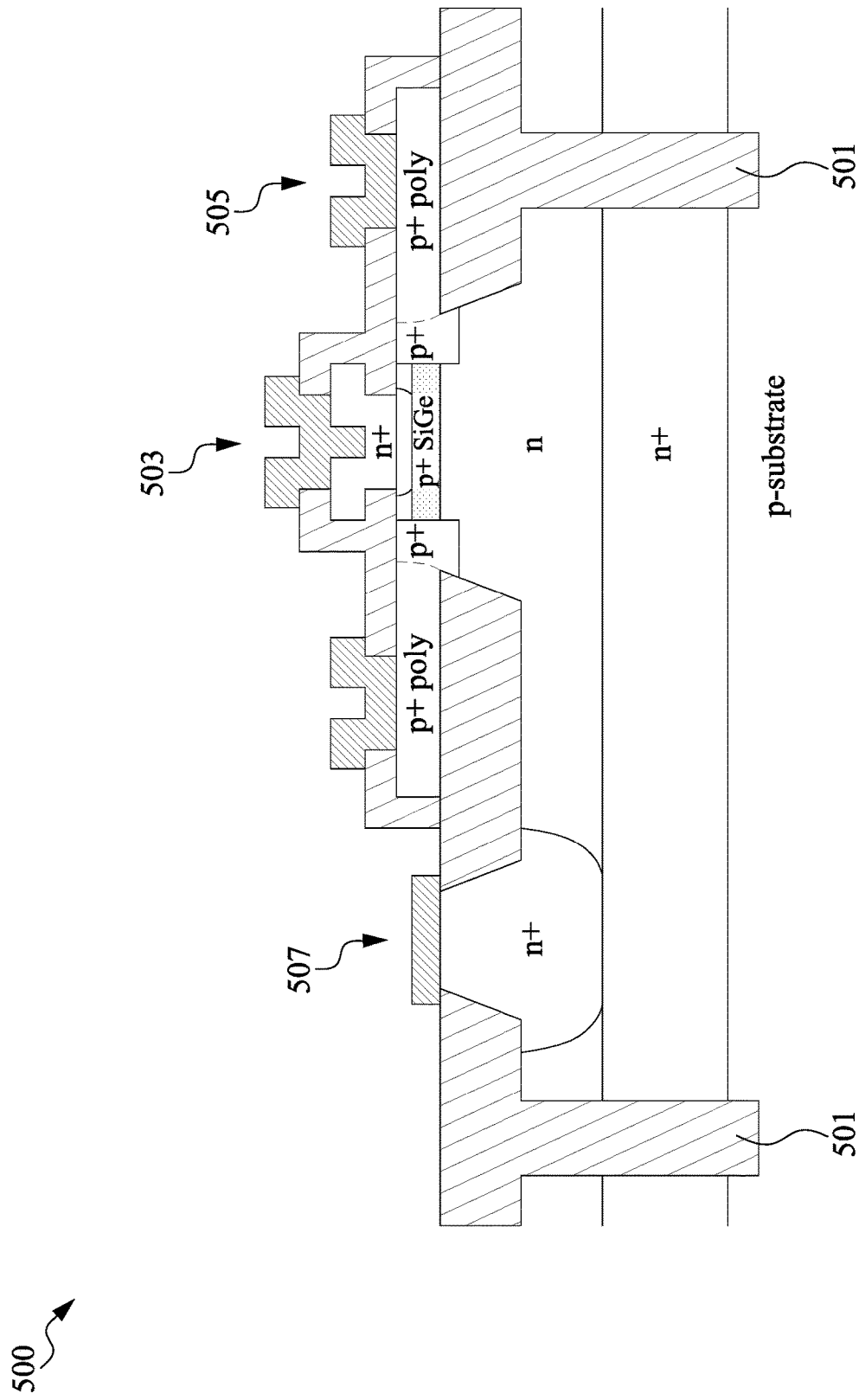
FIG. 5 illustrates a schematic cross-sectional view of a HBT in accordance with some embodiments of the present disclosure.

In some embodiments, the method 100 may be used to form a deep trench isolation (DTI). The DTI may be used as an isolation in different semiconductor applications, for example, but the not limited thereto, a heterojunction bipolar transistor (HBT), such as silicon germanium (SiGe) HBT. Refer to FIG. 5. FIG. 5 illustrates a schematic cross-sectional view of a SiGe HBT in accordance with some embodiments of the present disclosure. The HBT as shown in FIG. 5 utilizes at least two different semiconductor materials for the emitter region 503, base region 505 and collector regions 507 disposed on a substrate to form different energy bandgap at the emitter-base junction and base-collector junction, and DTI 501 is used for transistor isolation and reduction of collector-substrate capacitance. However, as the size of the transistor shrinks in the advanced technology nodes, the width of the DTI 501 shrinks as well, which results in the increase in the aspect ratio of the DTI 501. The increase in the aspect ratio of the DTI 501 adds challenges to the manufacturing process as it becomes harder to fill the trench of the DTI 501 without void or seal at the opening of the trench of the DTI 501. With the use of the method 100 of the present disclosure, the first dielectric layer may be selectively formed at the bottom of the trench DTI 501 shown in FIG. 5 so as to reduce the formation of void within the DTI 501 or a seal at the exposed opening of the trench of DTI 501.

Figure 6A:
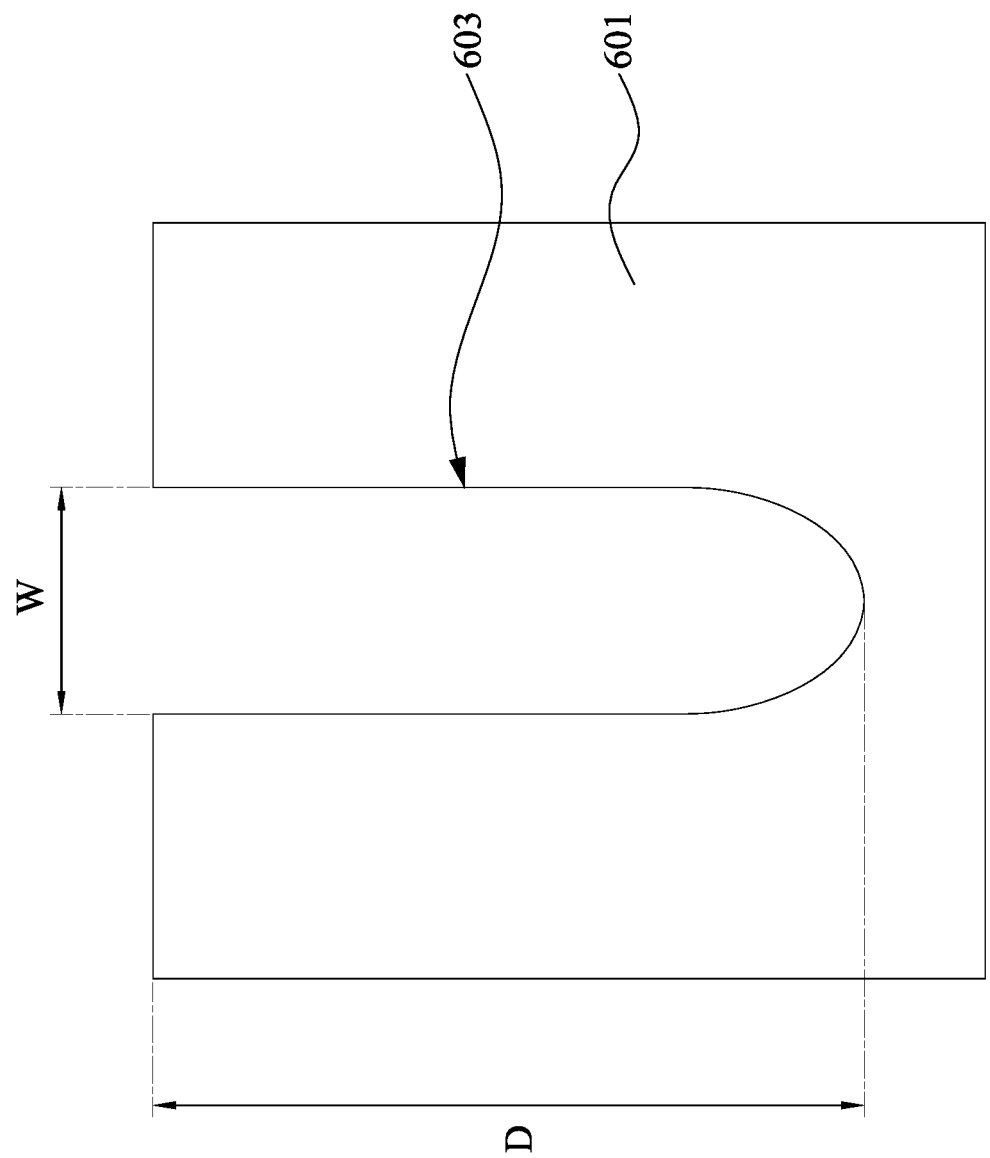
FIGS. 6A to 6D illustrate cross-sectional views of a portion of a semiconductor structure at various stage of formation in accordance with some embodiments of the present disclosure.

Refer to FIGS. 6A to 6D. FIGS. 6A to 6D illustrate cross-sectional views of a portion of a semiconductor structure 600 at various stage of formation in accordance with some embodiments of the present disclosure. Referring to FIG. 6A, in operation 101, a semiconductor substrate 601 including a semiconductor material, such as silicon, is received, wherein a trench 603 is formed in the semiconductor substrate 601. In some embodiments, a depth D of the trench 603 and a width W of the trench 603 may have an aspect ratio, and the aspect ratio is greater than 10. In some embodiments, the aspect ratio is between 10 and 12, but the disclosure is not limited thereto.

Figure 6B:
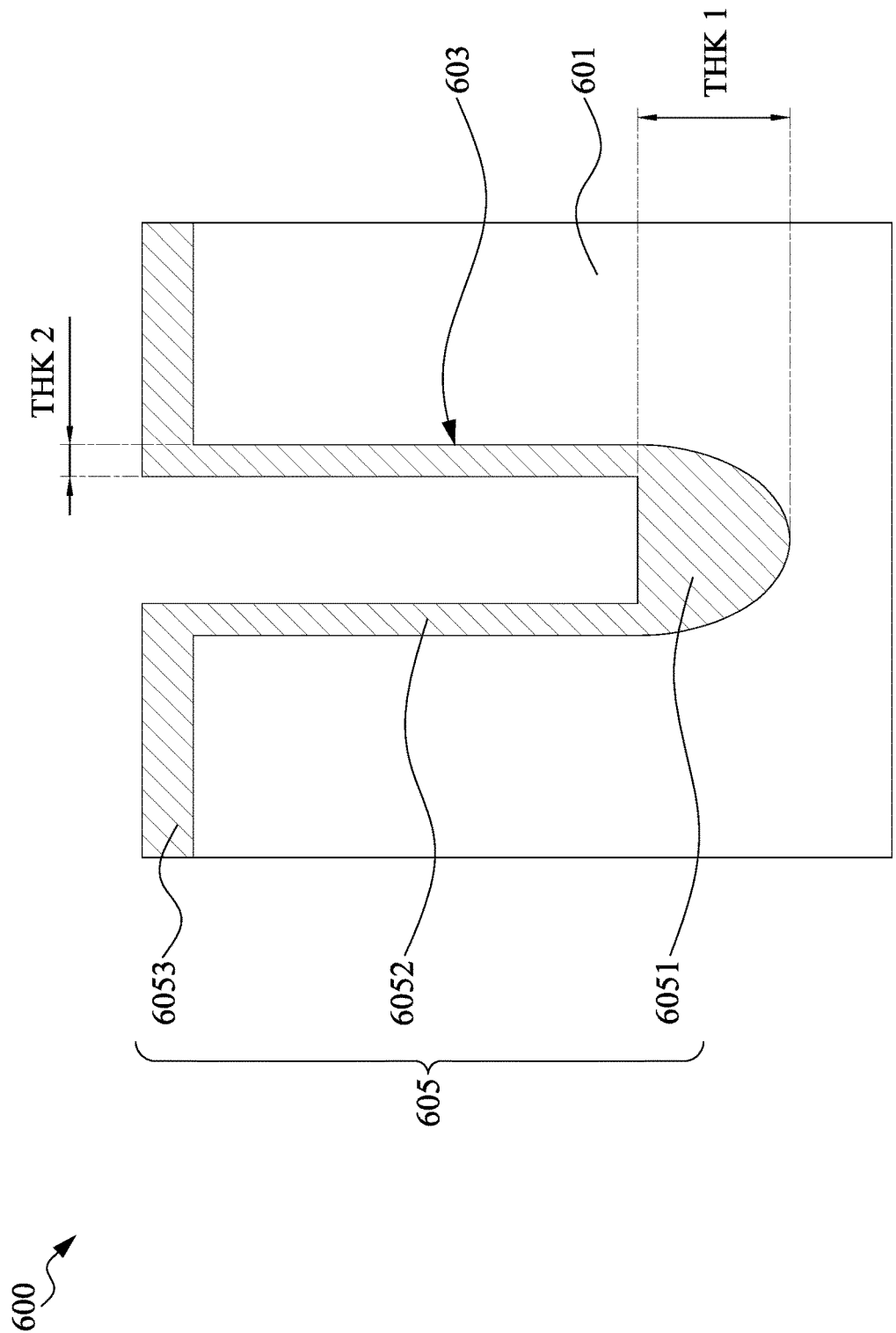

Referring to FIG. 6B, in operation 103, a nitridation is performed to the semiconductor substrate 601 exposed through the trench 603 to form a first dielectric layer 605, such as silicon nitride, wherein the first dielectric layer 605 includes a first portion over a bottom of the trench 6051, a second portion over sidewalls of the trench 6052 and a third portion 6053 over a surface of the semiconductor substrate 601, wherein a thickness THK 1 of the first portion 6051 is greater than a thickness THK 2 of the second portion 6052. In some embodiments, a thickness of the third portion 6053 may be greater than the thickness THK 2 of the second portion 6052. In some embodiments, nitridation may be performed by a plasma nitridation. In some embodiments, the plasma nitridation may use a plasma source such as inductively-coupled plasma (ICP), capacitively coupled plasma (CCP), microwave (MW) plasma or electron cyclotron resonance (ECR) plasma. In some embodiments, the first dielectric layer 605 may be selectively formed at the bottom of the trench 603 by applying an electric field toward a direction vertical to the bottom of the trench 603 so as to make the first dielectric layer 605 selectively form in the first portion 6051 over the bottom of the trench 603 more than in the second portion 6052 over sidewalls of the trench 603 so that the thickness THK 1 of the first portion 6051 is greater than the thickness THK 2 of the second portion 6052 so as to decrease the aspect ratio of the remaining space of the trench 603. In some embodiments, a thermal treatment may be performed to the semiconductor structure 600. In some embodiments, the thermal treatment may be carried out at a temperature of from 700° C. to 900° C. In some embodiments, a post-nitridation thermal treatment may further improve the electric properties of the first dielectric layer 605, for example, in terms of leakage current and etching rate, such as wet etching rate.

Figure 6C:
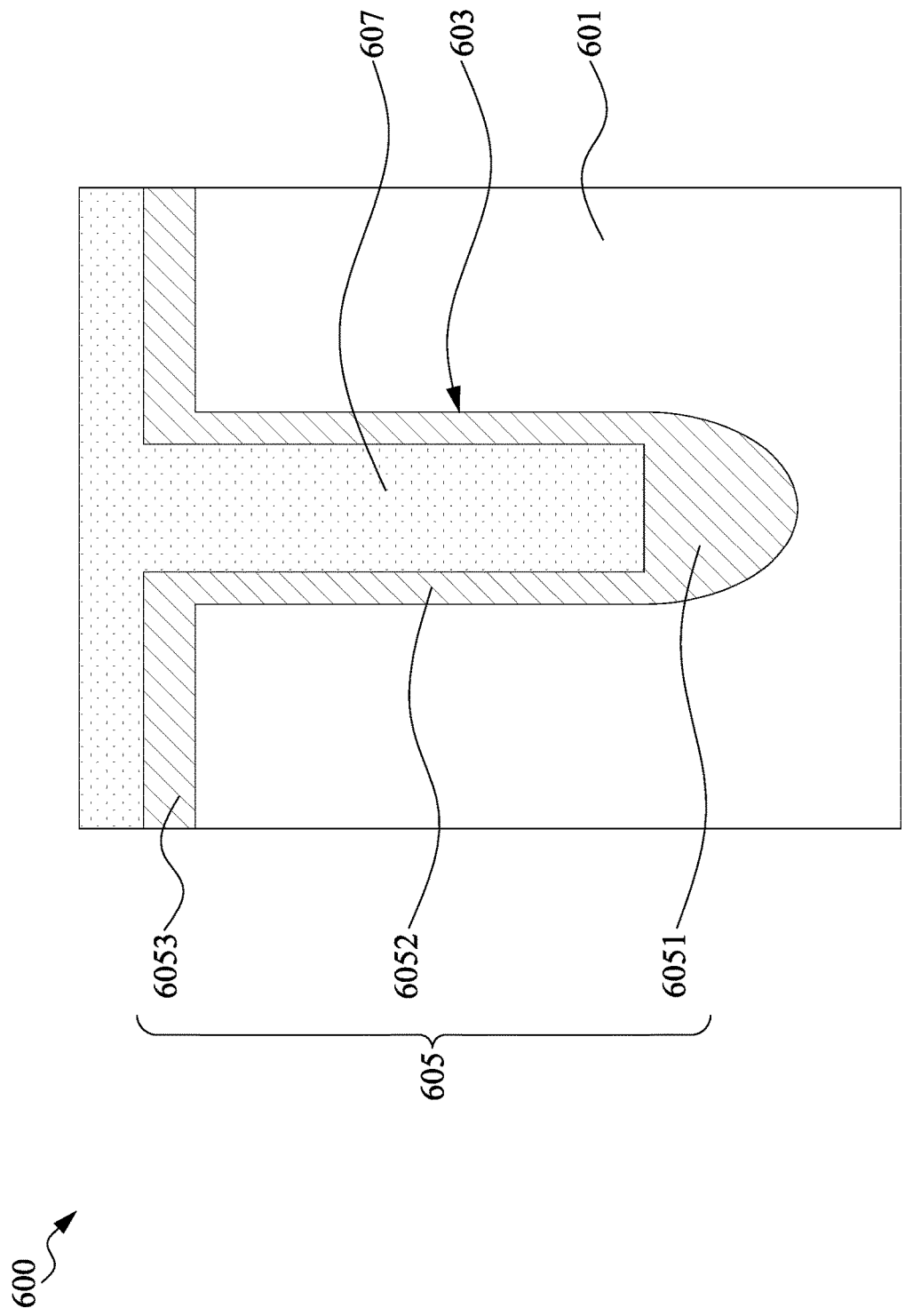

Referring to FIG. 6C, in some embodiments, after operation 103, a second dielectric layer 607 may be formed over the first dielectric layer 6051. In some embodiments, the second dielectric layer 607 may be formed over the first dielectric layer 605 in the trench 603 to fill the trench 603 with a decreased aspect ratio. In some embodiments, the second dielectric layer 607 may include an oxide, such as silicon oxide. In some embodiments, the first dielectric layer 605 and the second dielectric layer 607 may include different materials.

Figure 6D:
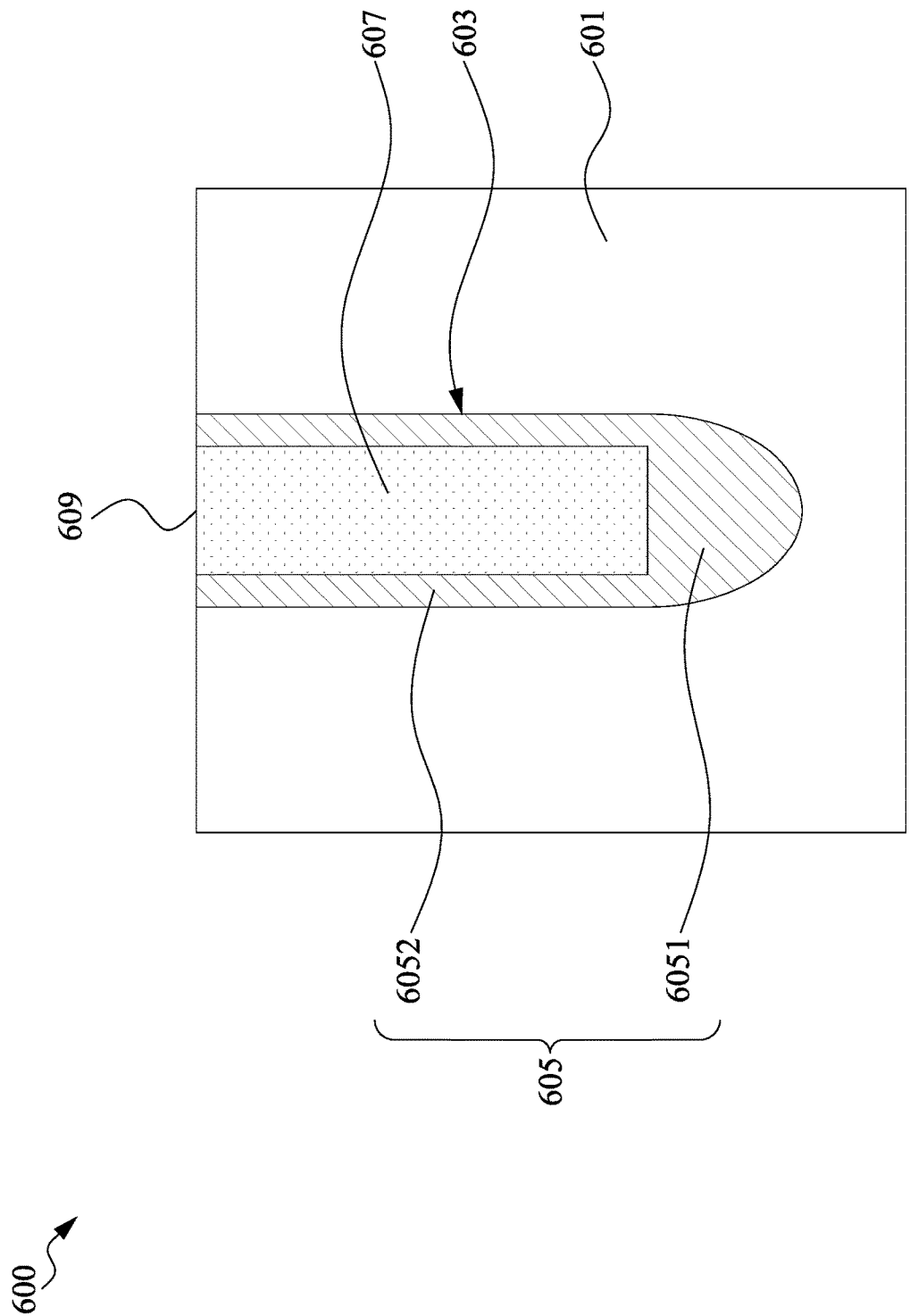

Referring to FIG. 6D, in some embodiments, after the second dielectric layer 607 is filled, a planarization operation, such as chemical mechanical planarization (CMP), may be performed to planarizing the semiconductor substrate 601 to expose the surface of the semiconductor substrate 601. In some embodiments, the third portion 6053 of the first dielectric layer 605 and a portion of the second dielectric layer 607 are remove to expose the surface of the semiconductor substrate 601, and to obtain a DTI 609 in the semiconductor substrate 601.

Figure 7B:
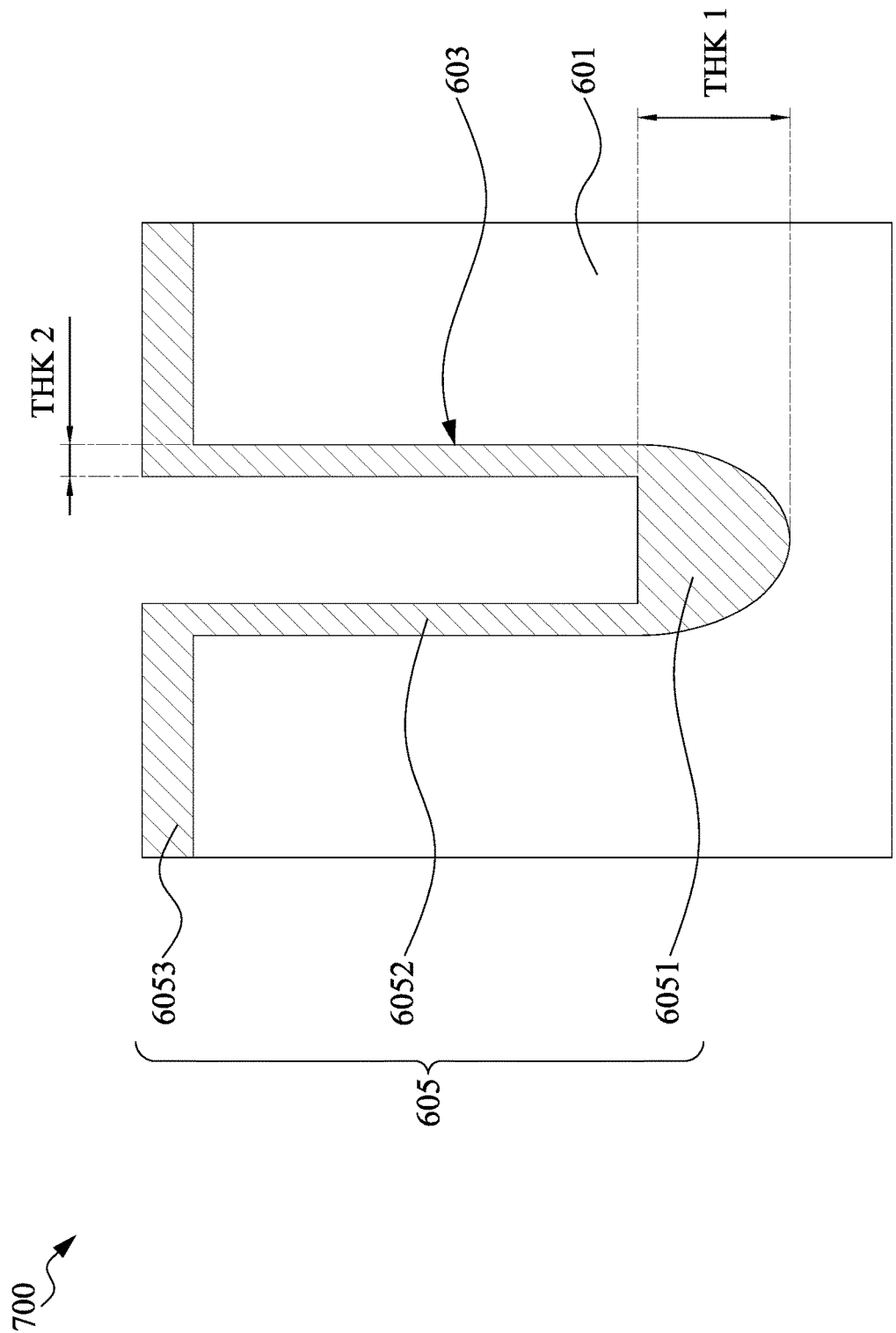

Refer to FIGS. 7A to 7D. FIGS. 7A to 7D illustrate cross-sectional views of a portion of a semiconductor structure 700 at various stage of formation in accordance with some embodiments of the present disclosure. Referring to FIG. 7A, subsequent to FIG. 6A and prior to operation 103, an insulating layer 701 may be formed over sidewalls and bottom of the trench 603. In some embodiments, the insulating layer 701 may include silicon oxide, such as $SiO_2$, SiOC:H, SiCO:H, SiONC:H or SiOCN:H. In some embodiments, a depth D of the trench 603 and a width W of the trench 603 may have an aspect ratio, and the aspect ratio is greater than 10. In some embodiments, the aspect ratio is between 10 and 12, but the disclosure is not limited thereto.

Referring to FIG. 7B, in operation 103, a nitridation is performed to the semiconductor substrate 601 to exposed through the trench 603 to form a first dielectric layer 605 by breaking the bond between silicon atom and oxygen atom and forming a linkage between the silicon atom and the nitrogen atom, wherein the first dielectric layer 605 includes a first portion 6051 over a bottom of the trench 603, a second portion 6052 over sidewalls of the trench 603 and a third portion 6053 over a surface of the semiconductor substrate 601. In some embodiments, the hydrogen atom, if present in the insulating layer 701, may be removed by the nitridation operation. In some embodiments, the first dielectric layer 605 may be selectively formed at the bottom of the trench 603 by "etching back," i.e., removing a portion the first dielectric layer 605 present at sidewalls of the trench 603 in a plasma apparatus as described above after nitridation operation, and by applying an electric field toward a direction vertical to the bottom of the trench 603 so as to make the removed portion of the first dielectric layer 605 selectively form in the first portion 6051 over the bottom of the trench 603 more than in the second portion 6052 over sidewalls of the trench 603 so that the thickness THK 1 of the first portion 6051 is greater than the thickness THK 2 of the second portion 6052 so as to decrease the aspect ratio of the remaining space of the trench 603. In some embodiments, a thermal treatment may be performed to the semiconductor structure 600. In some embodiments, the thermal treatment may be carried out at a temperature of from 700° C. to 900° C. In some embodiments, a post-nitridation thermal treatment may further improve the electric properties of the first dielectric layer 6051, for example, in terms of leakage current and etching rate, such as wet etching rate.

Figure 7C:
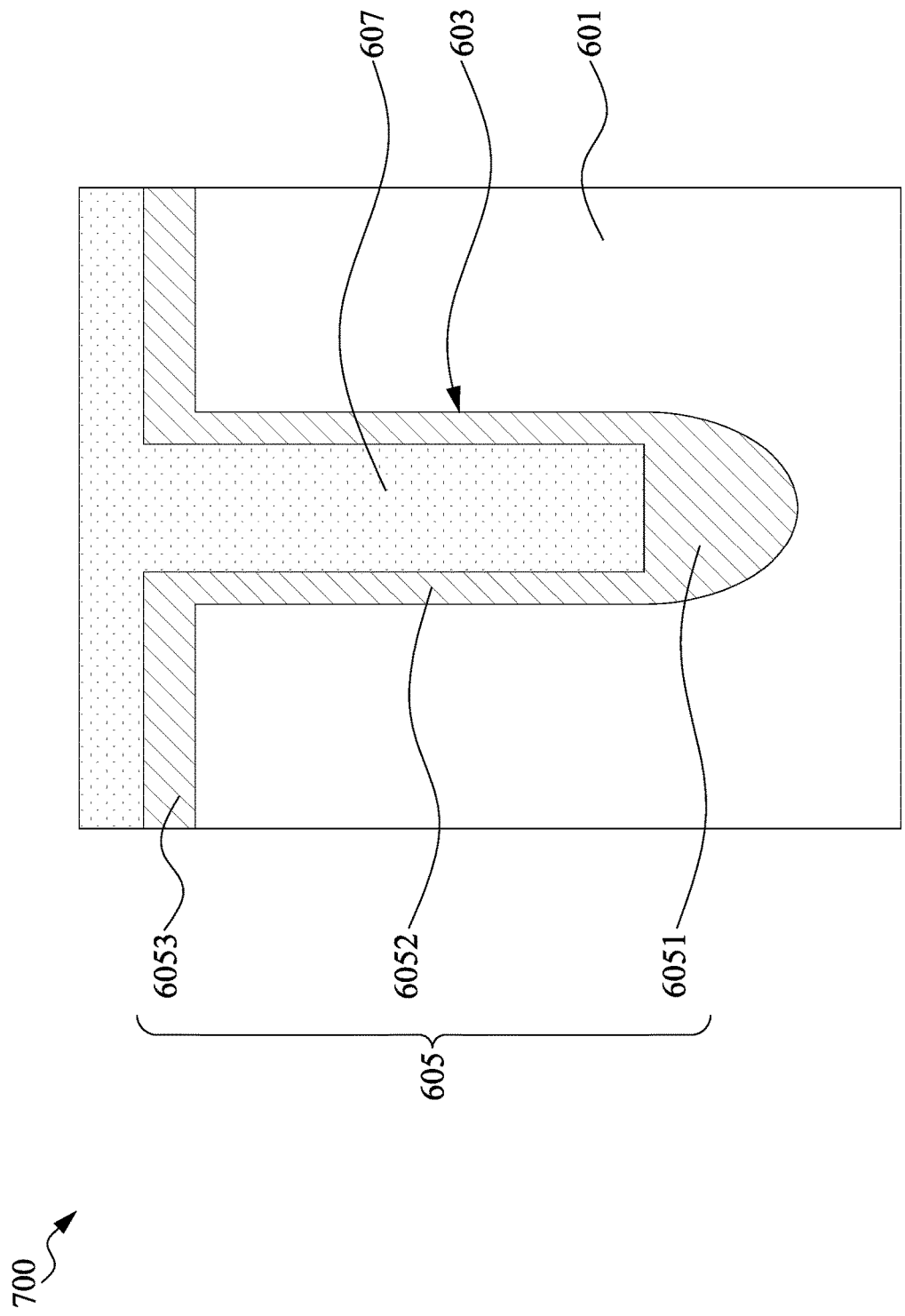

Referring to FIG. 7C, in some embodiments, after operation 103, a second dielectric layer 607 may be formed over the first dielectric layer 605. In some embodiments, the second dielectric layer may be formed over the first dielectric layer 605 in the trench 603 to fill the trench 603 with a decreased aspect ratio. In some embodiments, the second dielectric layer 607 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, the first dielectric layer 605 and the second dielectric layer 607 may include different materials.

Figure 7D:
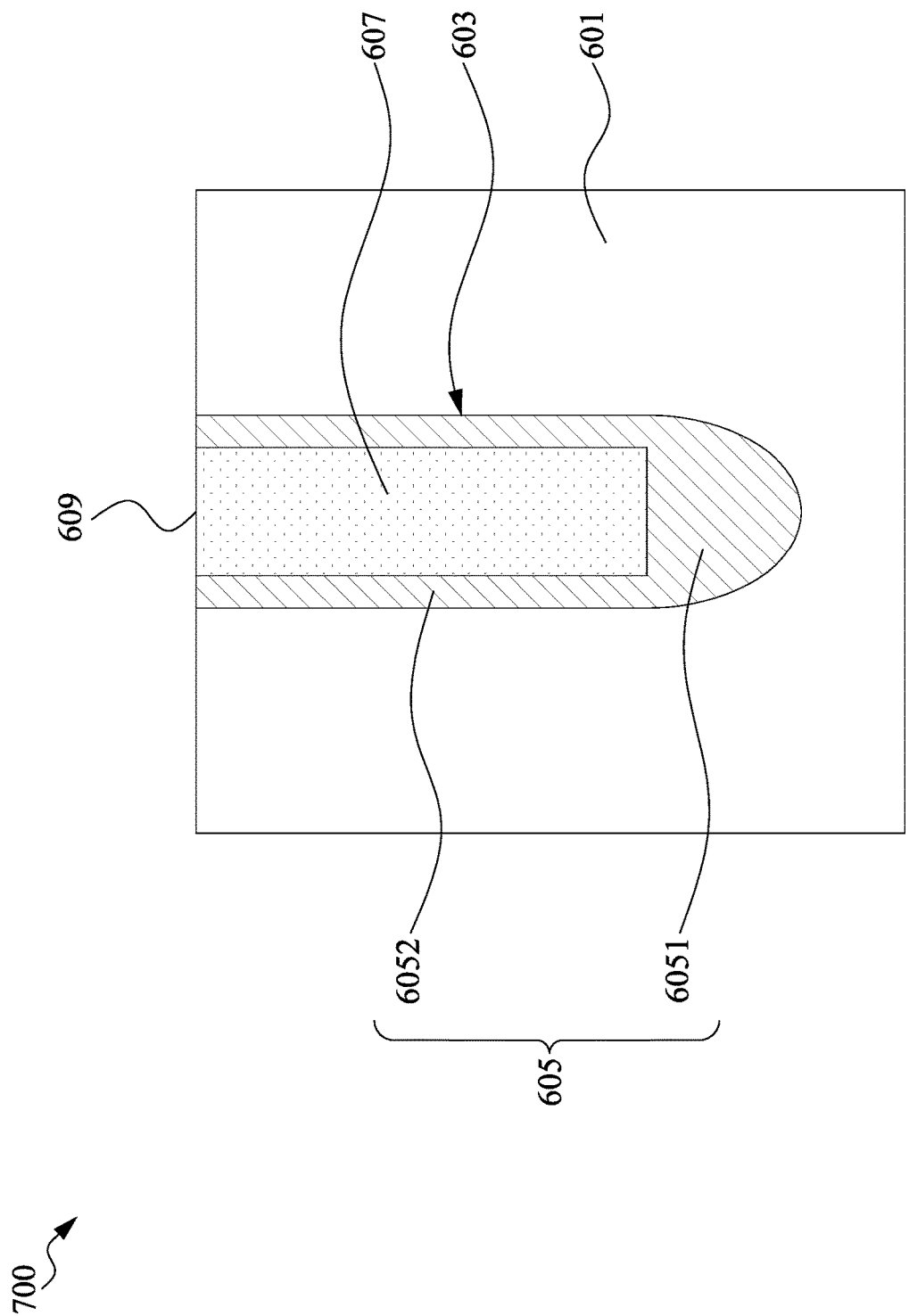

Referring to FIG. 7D, in some embodiments, after the second dielectric layer 607 is filled, a planarization operation, such as chemical mechanical planarization (CMP), may be performed to planarizing the semiconductor substrate 601 to expose the surface of the semiconductor substrate 601. In some embodiments, the third portion 6053 of the first dielectric layer 605 and a portion of the second dielectric layer 607 are remove to expose the surface of the semiconductor substrate 601, and to obtain a DTI 609 in the semiconductor substrate 601.

Figure 8A:
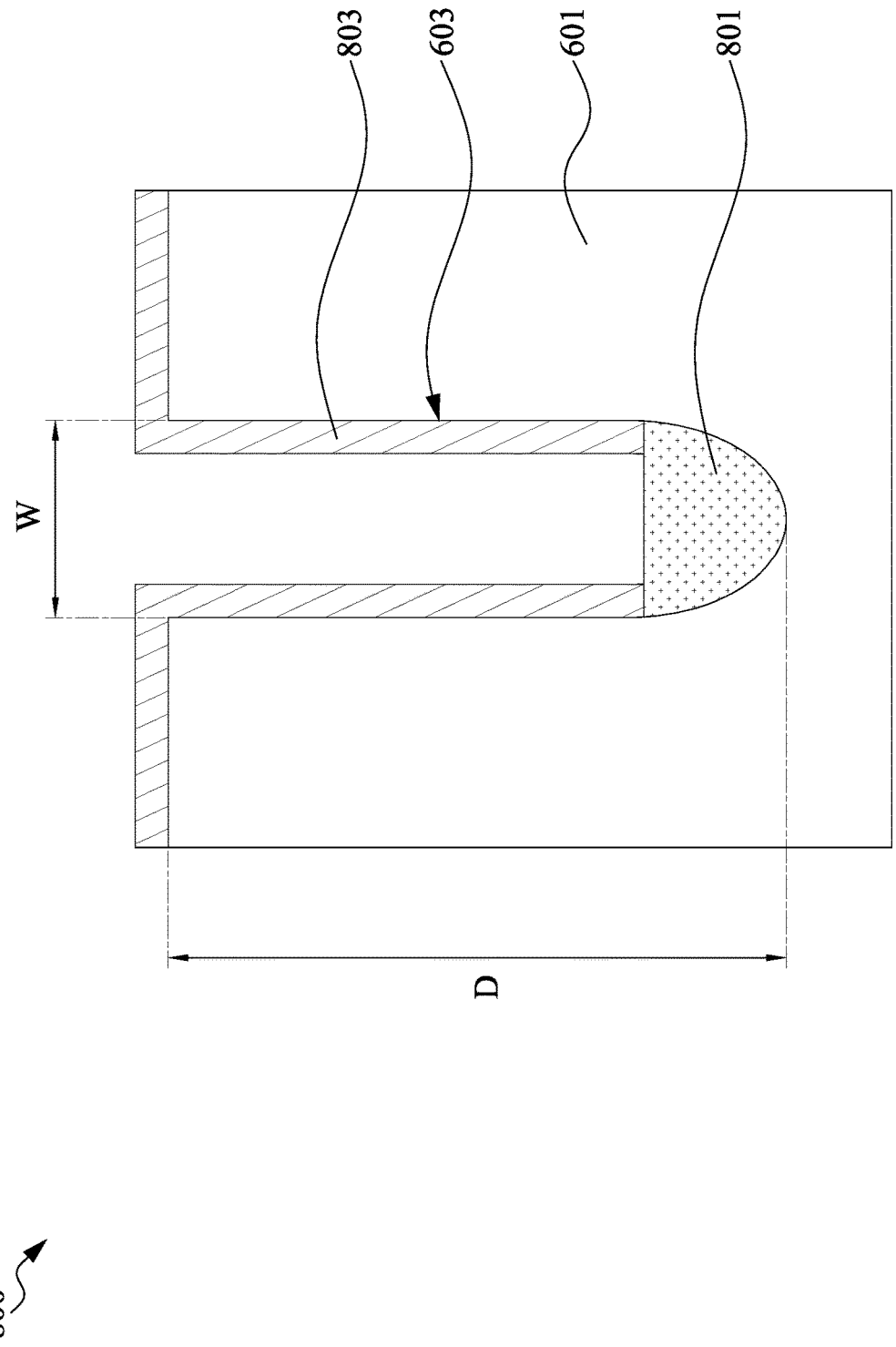
FIGS. 8A to 8D illustrate cross-sectional views of a portion of a semiconductor structure 800 at various stage of formation in accordance with some embodiments of the present disclosure.

Refer to FIGS. 8A to 8D. FIGS. 8A to 8D illustrate cross-sectional views of a portion of a semiconductor structure 800 at various stage of formation in accordance with some embodiments of the present disclosure. Referring to FIG. 8A, subsequent to FIG. 6A and prior to operation 103, an epitaxial structure 801 is formed in the trench 603. In some embodiments, the epitaxial structure 801 may be formed by a deposition operations such as chemical vapor deposition (CVD), plasma enhanced chemical vapor deposition (PECVD) or atomic layer deposition (ALD). In some embodiments, an insulating layer 803 may also be formed over sidewalls of the trench 603. In some embodiments, the insulating layer 803 may include silicon oxide, such as $SiO_2$, SiOC:H, SiCO:H, SiONC:H or SiOCN:H. In some embodiments, a depth D of the trench 603 and a width W of the trench 603 may have an aspect ratio, and the aspect ratio is greater than 10. In some embodiments, the aspect ratio is between 10 and 12, but the disclosure is not limited thereto.

Figure 8B:
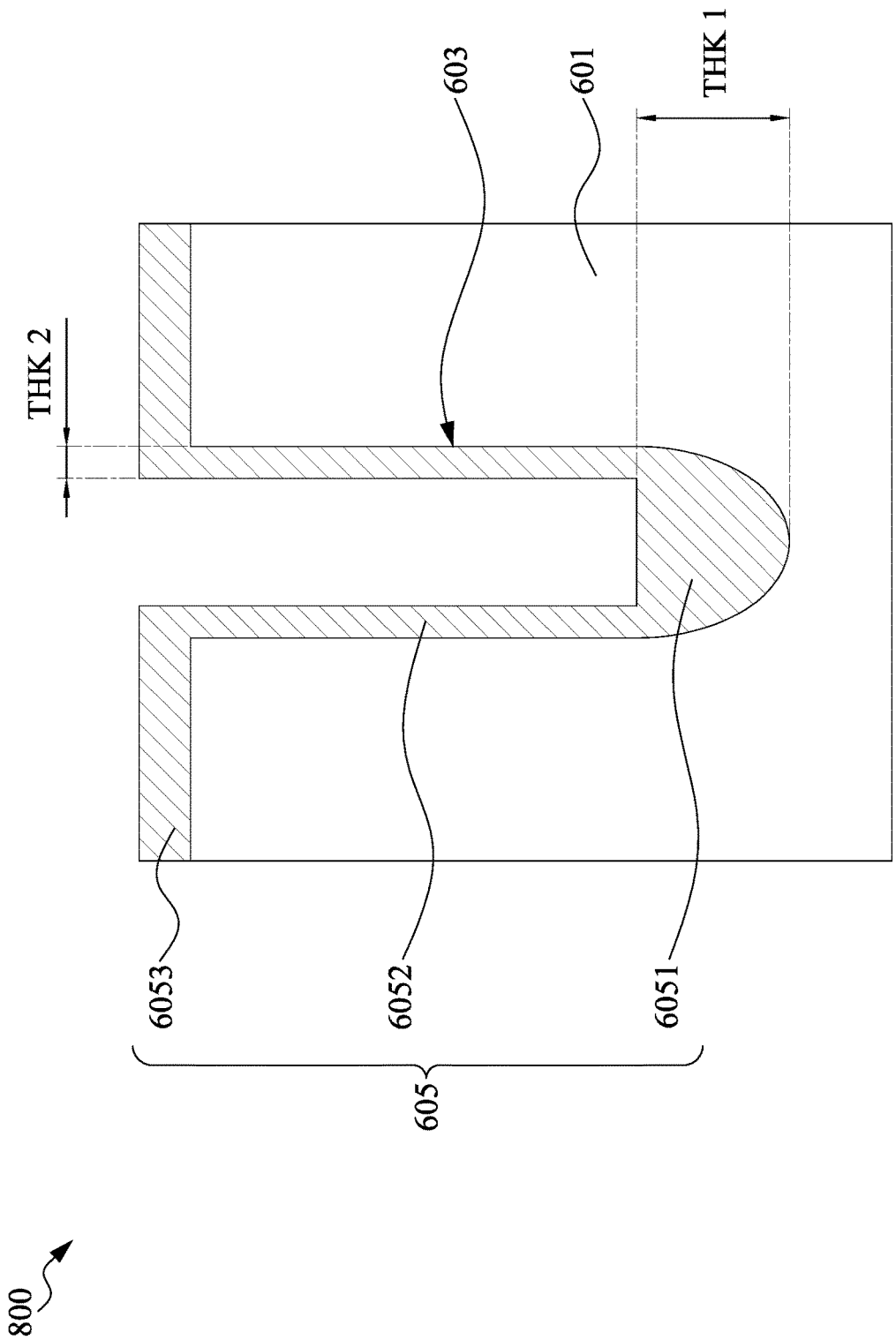

Referring to FIG. 8B, in operation 103, a nitridation is performed to the semiconductor substrate 601 to exposed through the trench 603 to form a first dielectric layer 605 by breaking the bond between silicon atom and oxygen atom of the insulating layer 803 and forming a linkage between the silicon atom and the nitrogen atom at sidewalls of the trench 603, and forming a linkage between the silicon atom of the epitaxial structure 801 and the nitrogen atom at bottom of the trench 603, wherein the first dielectric layer 605 includes a first portion 6051 over a bottom of the trench 603, a second portion 6052 over sidewalls of the trench 603 and a third portion 6053 over a surface of the semiconductor substrate 601. In some embodiments, the hydrogen atom, when present in the insulating layer 803, may be removed by the nitridation operation. In some embodiments, the first dielectric layer 605 may be selectively formed at the bottom of the trench 603 by etching back the first dielectric layer 605 originally present at sidewalls of the trench 603 in a plasma apparatus as described above and by applying an electric field toward a direction vertical to the bottom of the trench 603 so as to make the first dielectric layer 605 selectively form in the first portion 6051 over the bottom of the trench 603 more than in the second portion 6052 over sidewalls of the trench 603. In some embodiments, the epitaxial structure 801 is entirely transferred to be the first portion 6051 of the first dielectric layer 605. Such that the thickness THK 1 of the first portion 6051 is greater than the thickness THK 2 of the second portion 6052 so as to decrease the aspect ratio of the remaining space of the trench 603. In some embodiments, a thermal treatment may be performed to the semiconductor structure 600. In some embodiments, the thermal treatment may be carried out at a temperature of from 700° C. to 900° C. In some embodiments, a post-nitridation thermal treatment may further improve the electric properties of the first dielectric layer 605, for example, in terms of leakage current and etching rate, such as wet etching rate.

Figure 8C:
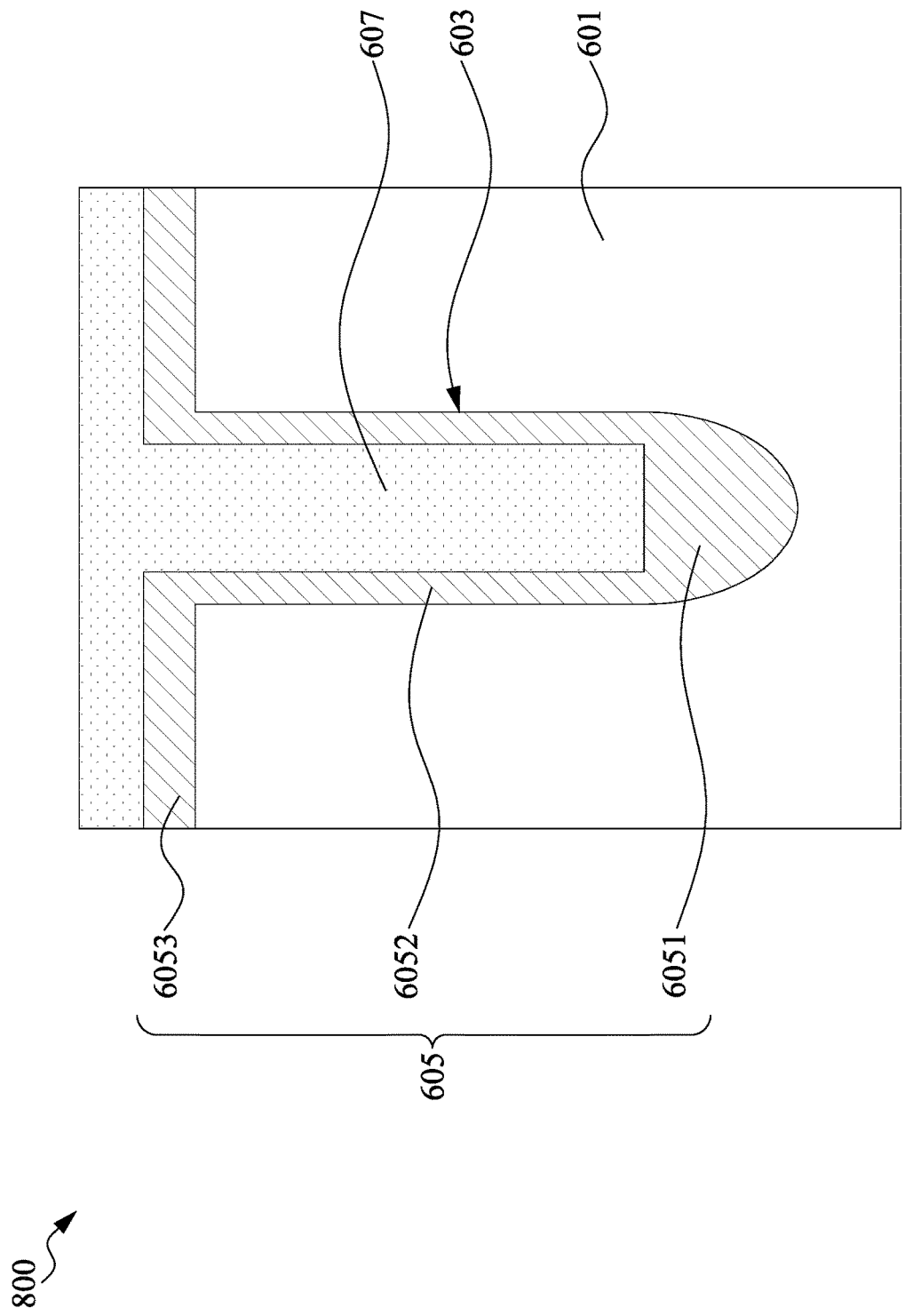
Figure 8D:
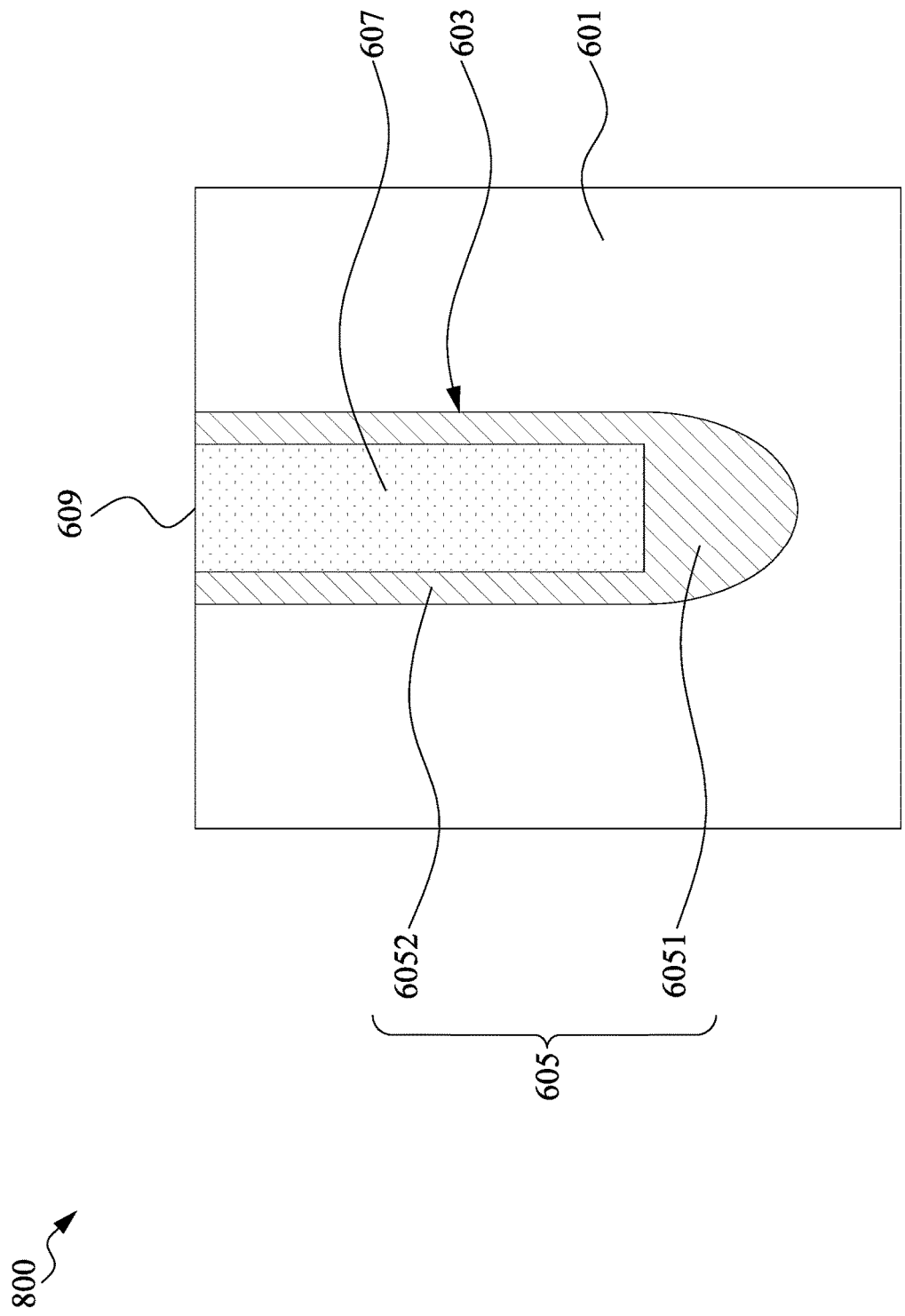

Referring to FIG. 8C, in some embodiments, after operation 103, a second dielectric layer 607 may be formed over the first dielectric layer 6051. In some embodiments, the second dielectric layer may be formed over the first dielectric layer 6051 in the trench 603 to fill the trench 603 with a decreased aspect ratio. In some embodiments, the second dielectric layer 6053 may include an oxide, such as silicon oxide. In some embodiments, the first dielectric layer 6051 and the second dielectric layer 6053 may include different materials. Referring to FIG. 8D, in some embodiments, after the second dielectric layer 6053 is filled, a planarization operation, such as chemical mechanical planarization (CMP), may be performed to planarizing the semiconductor substrate 601 to expose the surface of the semiconductor substrate 601. In some embodiments, the third portion 6053 of the first dielectric layer 605 and a portion of the second dielectric layer 607 are remove to expose the surface of the semiconductor substrate 601, and to obtain a DTI 609 in the semiconductor substrate 601.

In some embodiments, the method 100 may be used to form an isolation structure over the semiconductor substrate. For example, the method 100 may be used to form the first dielectric layer in an interlayer dielectric (ILD) structure between two semiconductor devices. In some embodiments, the devices may be a multi-gate field-effect transistor (FET) device, including a fin FET (FinFET) device and a gate-all-around (GAA) FET device.

Figure 9A:
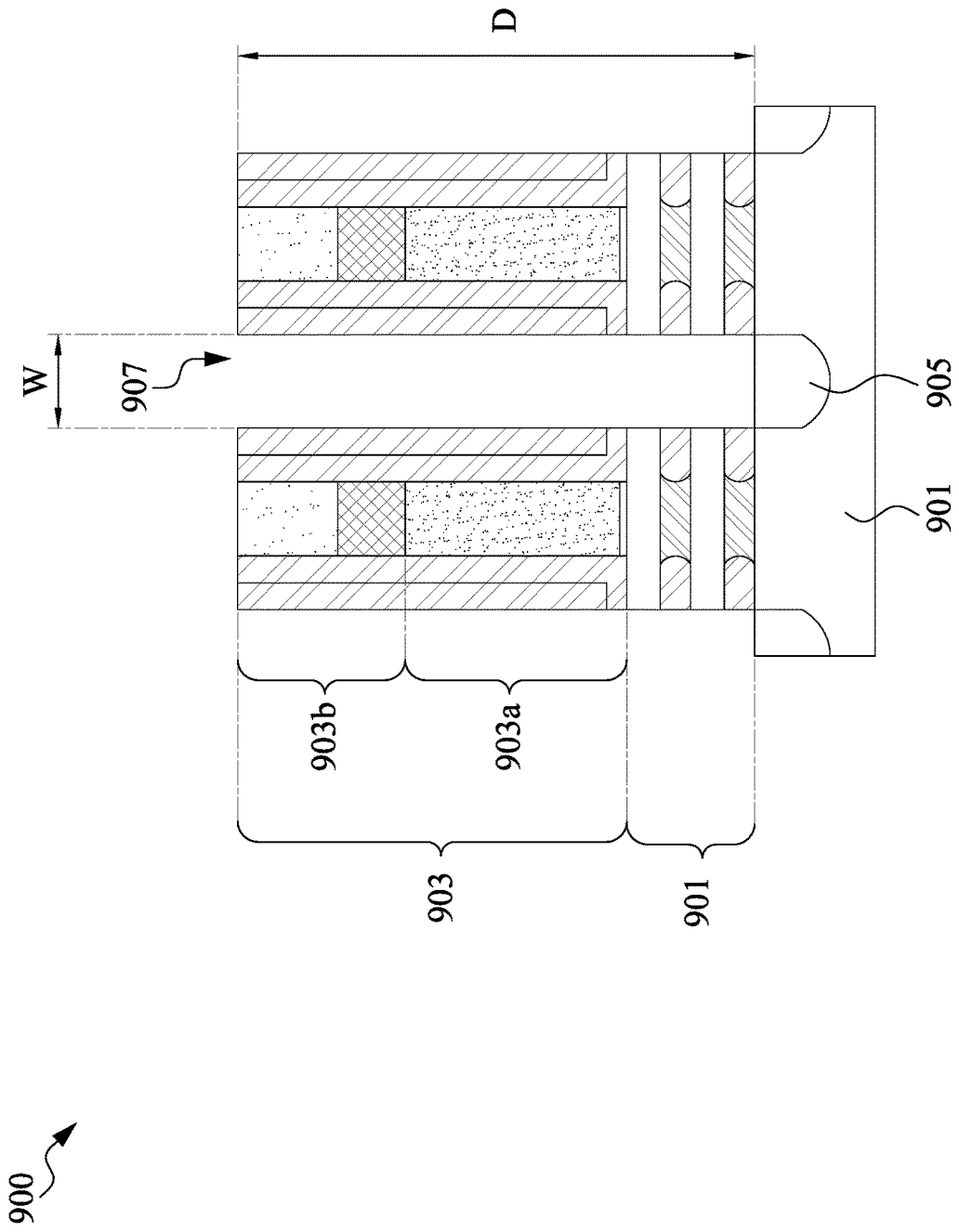
FIGS. 9A to 9D illustrate cross-sectional views of a portion of a GAA FET device 900 at various stage of formation in accordance with some embodiments of the present disclosure.

Refer to FIGS. 9A to 9D. FIGS. 9A to 9D illustrate cross-sectional views of a portion of a GAA FET device 900 at various stage of formation in accordance with some embodiments of the present disclosure. Referring to FIG. 9A, in some embodiments, a plurality of gate features 903 are formed over the semiconductor substrate 901. The gate features 903 may be formed over at least a fin structure 901. In some embodiments, the gate feature 903 is a sacrificial gate 903. Further, a trench 907 is formed between the gate features 903. In some embodiments, an epitaxial structure 905 may be formed in the semiconductor substrate 901 between two adjacent gate features 903. Additionally, the epitaxial structure 905 may be exposed through a bottom of the trench 907. In some embodiments, in the advanced technology nodes, the trench 907 between adjacent gate features 903 may have an aspect ratio greater than 10. In some embodiments, the sacrificial gates 903 may include at least a polysilicon layer 903a and a patterned mask 903b disposed over the polysilicon layer 903a for defining the sacrificial gates 903. In some embodiments, a depth D of the trench 907 and a width W of the trench 907 may have an aspect ratio, and the aspect ratio is greater than 10. In some embodiments, the aspect ratio is between 10 and 12, but the disclosure is not limited thereto.

Figure 9B:
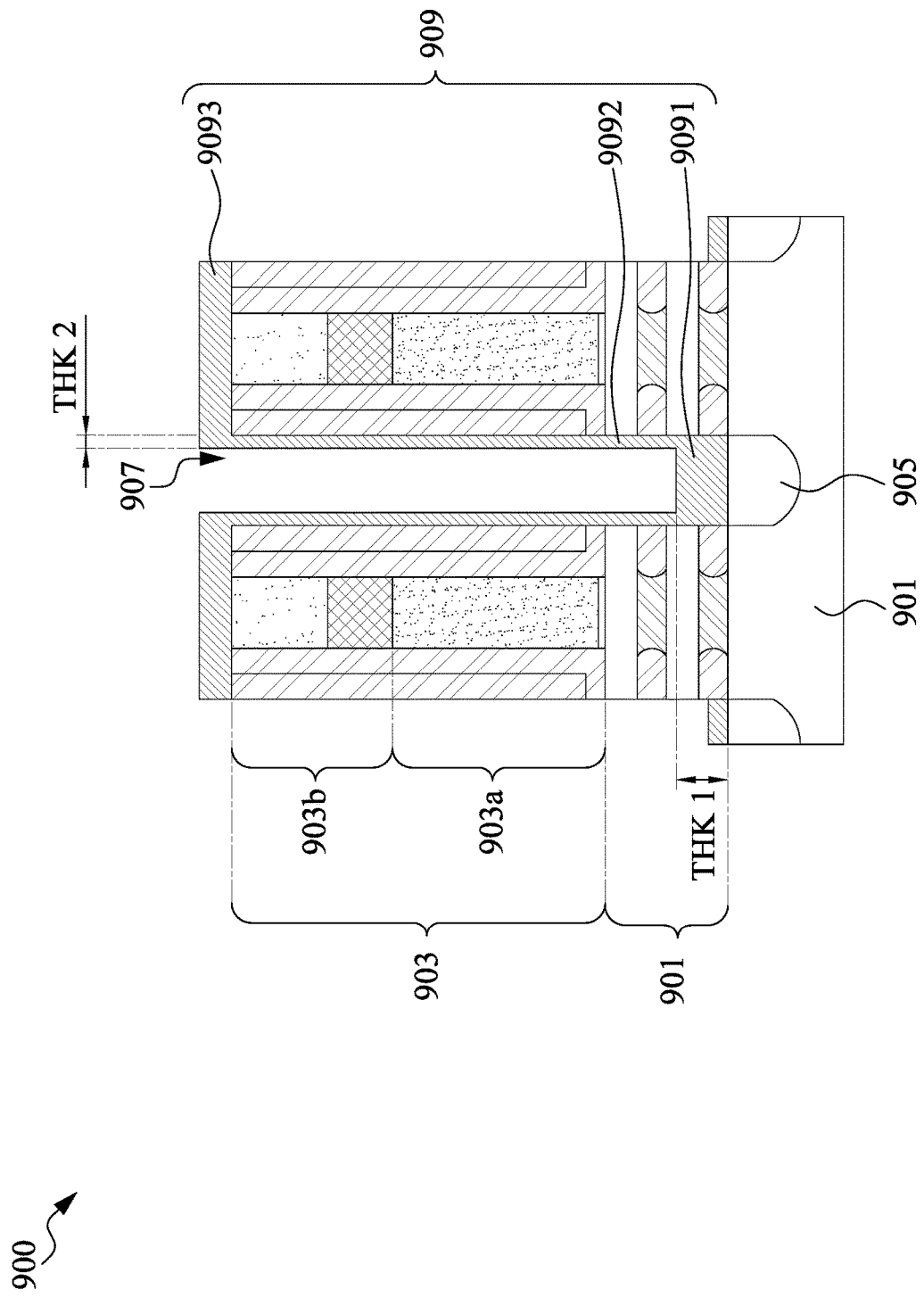

Referring to FIG. 9B, in some embodiments, at operation 103, a nitridation is performed to the semiconductor substrate 901 exposed through the trench 907 to form a first dielectric layer 909, wherein the first dielectric layer 909 comprises a first portion 9091 over a bottom of the trench 907, a second portion 9092 over sidewalls of the trench 907 and a third portion 9093 over a surface of the semiconductor substrate 901, wherein a thickness THK 1 of the first portion 9091 is greater than a thickness THK 2 of the second portion 9092. In some embodiments, the first dielectric layer 909 may be formed over an exposed surface of the sacrificial gate 903. In some embodiments, the aspect ratio of the trench 907 may be decreased by the bottom selective formation of the first dielectric layer 909.

Figure 9C:
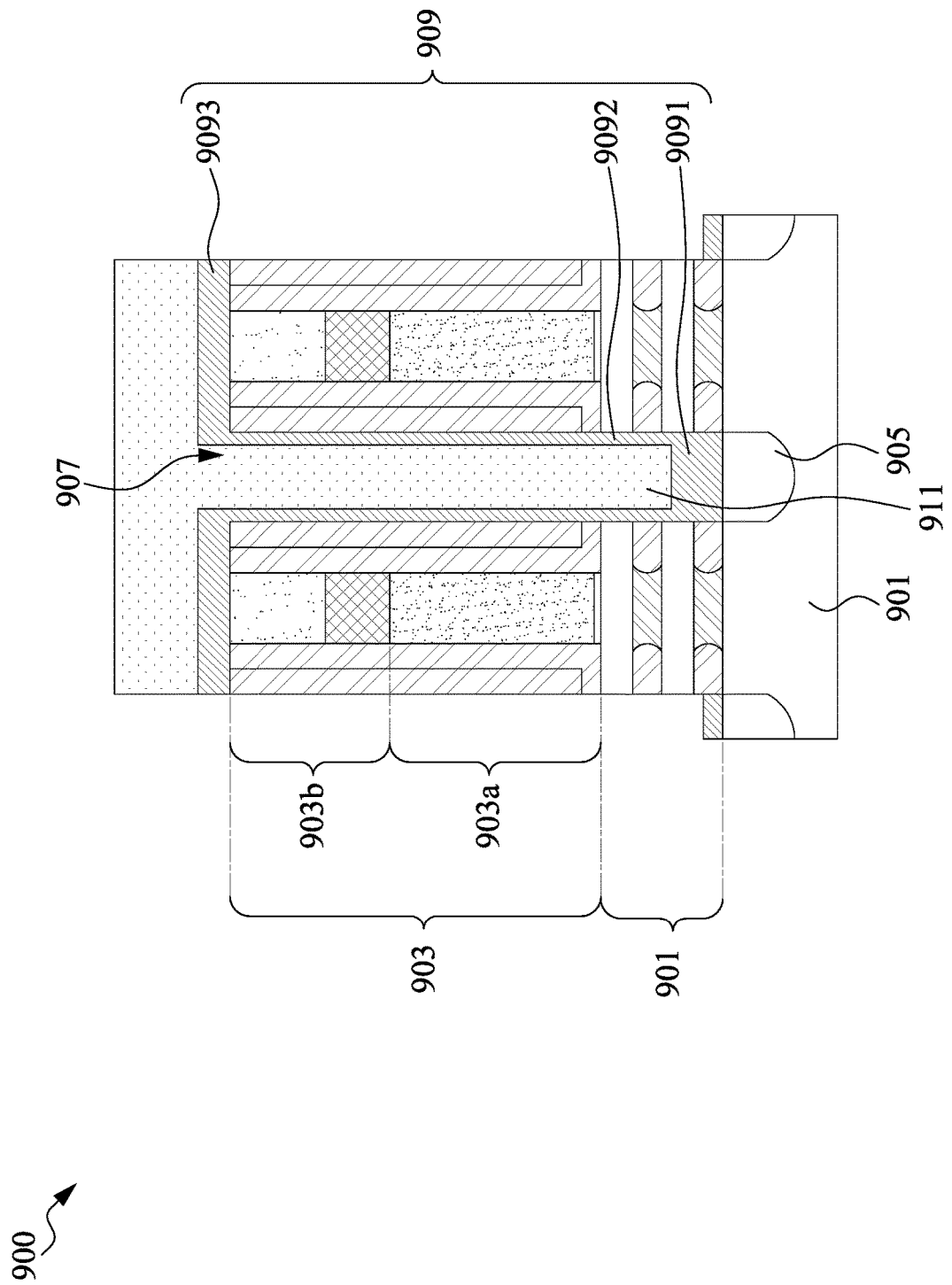

Referring to FIG. 9C, in some embodiments, after operation 103, a second dielectric layer 911 may be formed over the first dielectric layer 909. In some embodiments, the first dielectric layer 909 and the second dielectric layer 911 may comprise different materials. In some embodiments, the second dielectric layer 911 may be formed over the first dielectric layer 909 in the trench 907 to fill the trench 907 with a decreased aspect ratio.

Figure 9D:
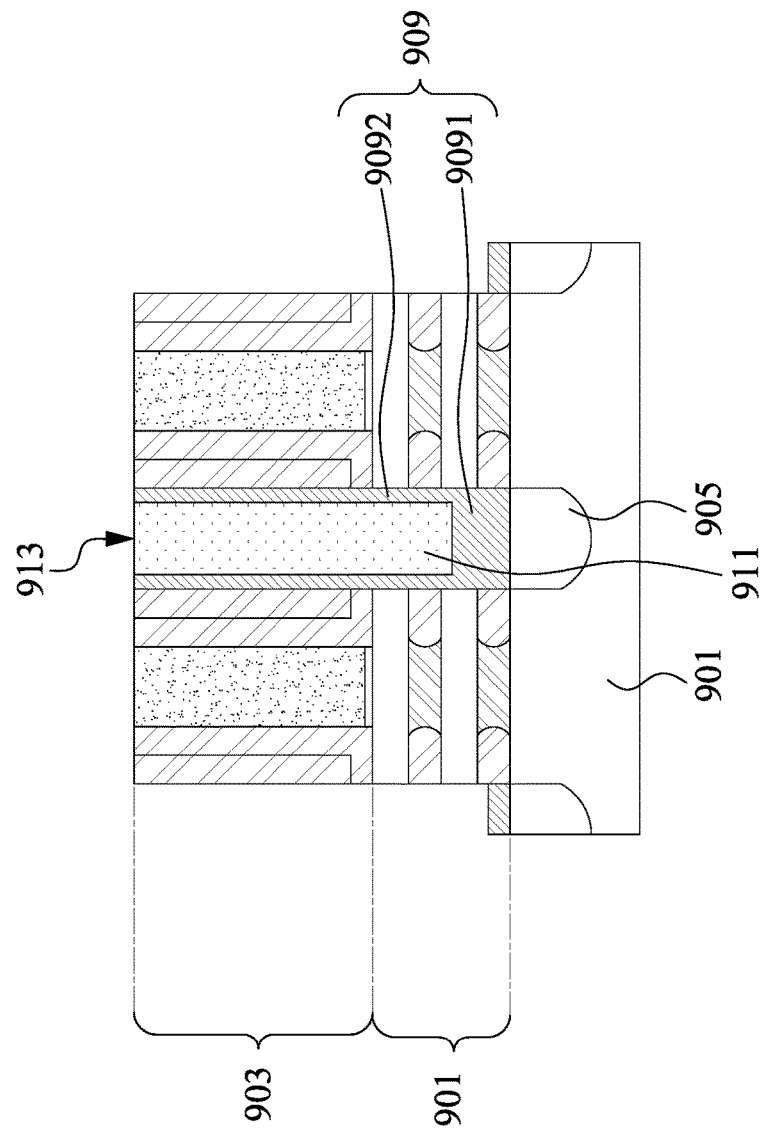

Referring to FIG. 9D, in some embodiments, after the second dielectric layer 911 is filled, a planarization operation, such as chemical mechanical planarization (CMP), may be performed to expose a top surface of the polysilicon layer 903a of the sacrificial gates 903 and to obtain an isolation structure 913 in the semiconductor substrate 901. In some embodiments, the exposed polysilicon layer 903a of the sacrificial gate 903 may be replaced with a metal gate structure, but the disclosure is not limited thereto.

Figure 10:
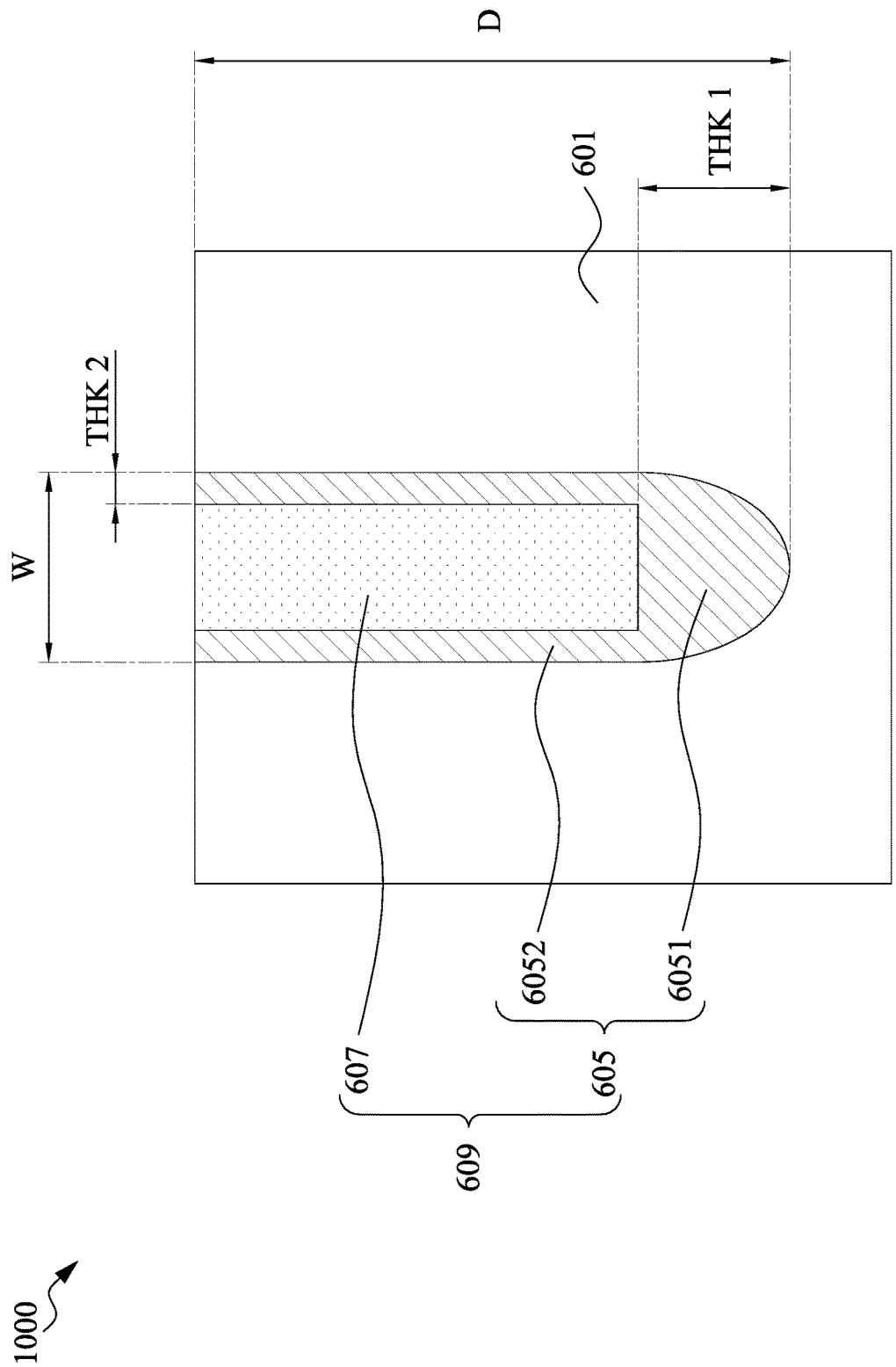
FIG. 10 illustrates a cross-sectional schematic view of a semiconductor structure 1000 in accordance with some embodiments of the present disclosure.

Refer to FIG. 10. FIG. 10 illustrates a cross-sectional schematic view of a semiconductor structure 1000 in accordance with some embodiments of the present disclosure. In some embodiments, a semiconductor structure 1000 may include a semiconductor substrate 601 and an isolation structure 609, wherein the isolation structure 609 may include a first dielectric layer 605 in contact with the semiconductor substrate 601, and a second dielectric layer 607 over the first dielectric layer 6051. In some embodiments, the first dielectric layer 605 is between the second dielectric layer 607 and the semiconductor substrate 601. In some embodiments, the first dielectric layer 605 may include a bottom portion 6051 and a sidewall portion 6052, and a thickness THK 1 of the bottom portion 6051 is greater than a thickness THK 2 of the sidewall portion 6052. In some embodiments, a top surface of the first dielectric layer 605, a top surface of the second dielectric layer 607 and a top surface of the semiconductor substrate 601 are aligned with each other.

In some embodiments, the first dielectric layer 605 and the second dielectric layer 607 may include different materials. In some embodiments, the semiconductor substrate 601 may include a semiconductor material and the first dielectric layer 605 may include a nitride of the semiconductor material. In some embodiments, the semiconductor material may include a silicon-based (Si-based) material. In some embodiments, the Si-based material may include Epi-Si, Epi-Si:P, Epi-SiGe:B, Poly-Si, amorphous-Si, SiNC:H, SiCN:H, SiNCO:H, SiOC:H, SiCO:H, SiONC:H, SiOCN:H, or combinations thereof. In some embodiments, the first dielectric layer 6051 may be produced by nitriding the semiconductor material within a trench 603 in the semiconductor substrate 601. In some embodiments, the semiconductor-based material may further be nitride by a nitridation operation to form a first dielectric layer 605. In some embodiments, the second dielectric layer 607 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

In some embodiments, the thickness THK 1 of the bottom portion 6051 and the thickness THK 2 of the sidewall portion 6052 has a ratio greater than 4. In some embodiments, a depth D of the isolation structure 609 and a width W of the trench 609 may have an aspect ratio, and the aspect ratio is greater than 10. In some embodiments, the aspect ratio is between 10 and 12, but the disclosure is not limited thereto. In some embodiments, the first dielectric layer 605 may be hydrogen-free.

Figure 11:
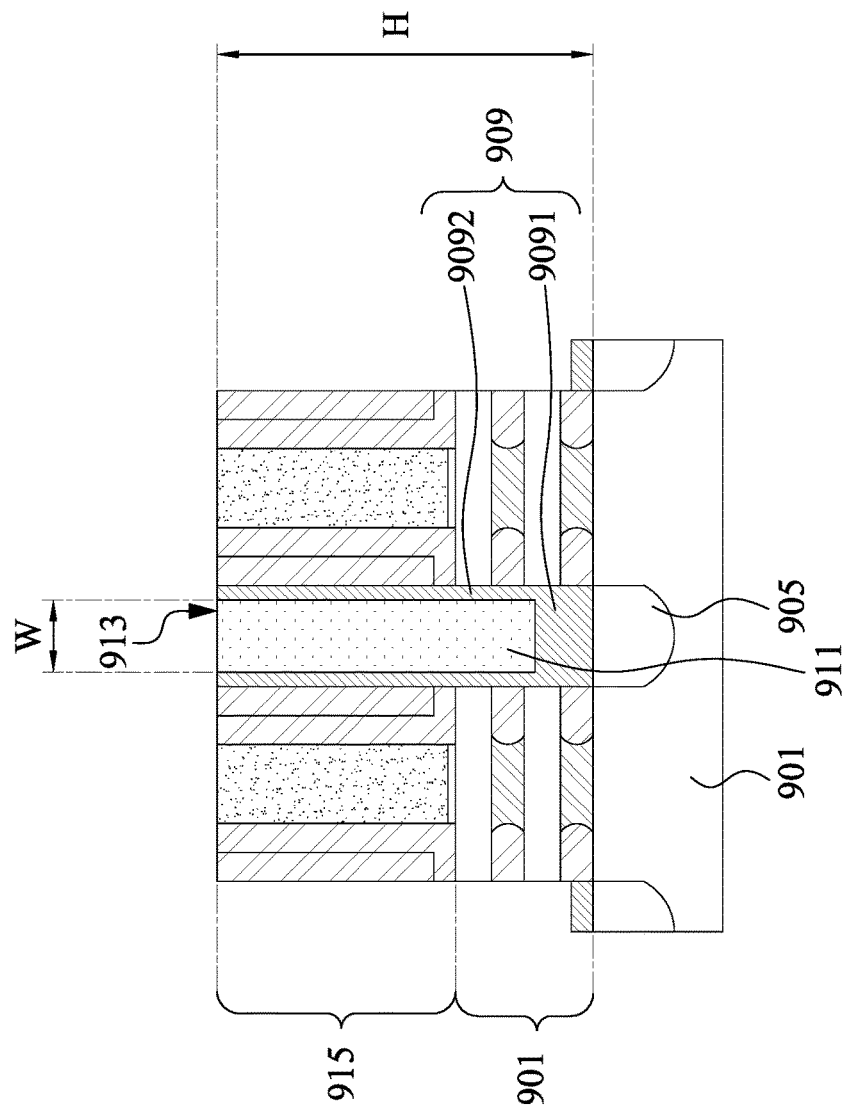
FIG. 11 illustrates a cross-sectional schematic view of a semiconductor structure 1100 in accordance with some embodiments of the present disclosure.

Refer to FIG. 11. FIG. 11 illustrates a cross-sectional schematic view of a semiconductor structure 1100 in accordance with some embodiments of the present disclosure. In some embodiments, a semiconductor structure 1100 may include a plurality of metal gate structures 915 disposed over a substrate 901 extending at a direction vertical to a surface of the substrate 901, an epitaxial structure 905 between two adjacent metal gate structures 915, a first dielectric layer 909 over the epitaxial structure 905, and a second dielectric layer 911 over the first dielectric layer 909, wherein the epitaxial structure 905 includes a semiconductor material, and the first dielectric layer 909 comprises a nitride of the semiconductor material. In some embodiments, the first dielectric layer 909 and the second dielectric layer 911 form an isolation structure 913.

In some embodiments, a height H of the isolation structure 913 and a width W of the isolation structure 913 may have an aspect ratio, and the aspect ratio is greater than 10. In some embodiments, the aspect ratio is between 10 and 12, but the disclosure is not limited thereto.

In some embodiments, the first dielectric layer 909 and the second dielectric layer 911 may include different materials. In some embodiments, the first dielectric layer 909 and the second dielectric layer may include materials as described above with respect to the first dielectric layer 605 and the second dielectric layer 607. In some embodiments, the epitaxial structure 905 may include dopants, such as $N^+$ dopants or $P^-$ dopants.

In the present disclosure, a semiconductor structure including a semiconductor substrate and an isolation structure disposed in the semiconductor substrate is provided. The isolation structure may include a first dielectric layer in contact with the semiconductor substrate and a second dielectric layer over the first dielectric layer. The first dielectric layer is between the second dielectric layer and the semiconductor substrate, the first dielectric layer comprises a bottom portion and a sidewall portion, and a thickness of the bottom portion is greater than a thickness of the sidewall portion. The semiconductor structure with a first dielectric layer selectively formed in the bottom of the trench more than formed in the sidewalls of the trench may help decrease the aspect ratio of the trench so as to facilitate the following dielectric material filling into the trench to form the isolation structure, and may reduce the chance of forming voids within the trench and/or a seal at the opening of the trench, which may lead to undesired defects in the isolation structure and undesired leakage issue between adjacent semiconductor device/structures. The isolation structure may also be used in a semiconductor including a plurality of gate features disposed over as substrate extending at a direction vertical to a surface of the substrate.

In some embodiments, a semiconductor structure is provided. The semiconductor structure includes a semiconductor substrate and an isolation structure disposed in the semiconductor substrate, wherein the isolation structure includes a first dielectric layer in contact with the semiconductor substrate; and a second dielectric layer over the first dielectric layer, wherein the first dielectric layer is between the second dielectric layer and the semiconductor substrate, the first dielectric layer comprises a bottom portion and a sidewall portion, and a thickness of the bottom portion is greater than a thickness of the sidewall portion.

In some embodiments, a semiconductor structure is provided. The semiconductor structure includes a plurality of gate features disposed over a substrate extending at a direction vertical to a surface of the substrate, an epitaxial structure between two adjacent gate features, a first dielectric layer over the epitaxial structure, and a second dielectric layer over the first dielectric layer, wherein the epitaxial structure comprises a semiconductor material, and the first dielectric layer comprises a nitride of the semiconductor material.

In some embodiments, a method of forming a semiconductor structure is provided. The methods includes following operations. A semiconductor substrate including a semiconductor material is received. A trench is formed in the semiconductor substrate. Nitridation is performed to the semiconductor substrate exposed through the trench to form a first dielectric layer, wherein the first dielectric layer includes a first portion over a bottom of the trench, a second portion over sidewalls of the trench and a third portion over a surface of the semiconductor substrate, and wherein a thickness of the first portion is greater than a thickness of the second portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
receiving a semiconductor substrate comprising a semiconductor material, wherein a trench is formed in the semiconductor substrate;
performing a nitridation to the semiconductor substrate exposed through the trench to form a first dielectric layer, wherein the first dielectric layer comprises a first portion over a bottom of the trench, a second portion over sidewalls of the trench and a third portion over a surface of the semiconductor substrate;
forming a second dielectric layer over the first dielectric layer; and
planarizing the semiconductor substrate,
wherein the first dielectric layer and the second dielectric layer comprise different materials, and
wherein a thickness of the first portion is greater than a thickness of the second portion.

2. The method of claim 1, wherein an aspect ratio of the trench is greater than 10.

3. The method of claim 1, further comprising forming an epitaxial structure prior to the performing of the nitridation.

4. The method of claim 1, further including performing a thermal treatment after a reshaping the first dielectric layer.

5. The method of claim 4, wherein the thermal treatment is carried out at a temperature of from 700° C. to 900° C.

6. The method of claim 1, further comprising forming an insulating layer over the sidewalls and the bottom of the trench prior to performing nitridation to the semiconductor substrate.

7. The method of claim 1, comprising applying an electric field toward a direction vertical to the bottom of the trench during performing the nitridation to the semiconductor substrate exposed through the trench to form the first dielectric layer.

8. A method of forming a semiconductor structure, comprising:
forming a plurality of gate features over a semiconductor substrate, wherein the gate features extend at a direction vertical to a surface of the semiconductor substrate;
forming a trench in the semiconductor substrate between two adjacent gate features;
forming an epitaxial structure in the trench; and
performing a nitridation to the semiconductor substrate exposed through the trench to form a first dielectric layer, wherein the first dielectric layer comprises a first portion over a bottom of the trench, a second portion over sidewalls of the trench and a third portion over the surface of the semiconductor substrate,
wherein a thickness of the first portion is greater than a thickness of the second portion.

9. The method of claim 8, wherein an aspect ratio of the trench is greater than 10.

10. The method of claim 8, further including performing a thermal treatment after performing the nitridation.

11. The method of claim 10, wherein the thermal treatment is carried out at a temperature of from 700° C. to 900° C.

12. The method of claim 8, further comprising forming a second dielectric layer over the first dielectric layer.

13. The method of claim 12, wherein the second dielectric layer fills the trench.

14. The method of claim 8, further comprising planarizing the semiconductor substrate.

15. A method of forming a semiconductor structure, comprising:
receiving a semiconductor substrate comprising a semiconductor material, wherein a trench is formed in the semiconductor substrate;
forming an epitaxial structure in the trench, wherein the epitaxial structure comprises silicon;
forming an insulating layer over sidewalls of the trench, wherein the insulating layer comprising silicon oxide; and
performing a nitridation to form a first dielectric layer by breaking a bond between a silicon atom and an oxygen atom of the insulating layer and forming a linkage between the silicon atom and a nitrogen atom at the sidewalls of the trench, and forming a linkage between a silicon atom of the epitaxial structure and a nitrogen atom at a bottom of the trench, wherein the first dielectric layer comprises a first portion over the bottom of the trench, a second portion over the sidewalls of the trench and a third portion over a surface of the substrate,
wherein a thickness of the first portion is greater than a thickness of the second portion.

16. The method of claim 15, wherein an aspect ratio of the trench is greater than 10.

17. The method of claim 15, further including performing a thermal treatment after performing the nitridation.

18. The method of claim 17, wherein the thermal treatment is carried out at a temperature of from 700° C. to 900° C.

19. The method of claim 15, further comprising forming a second dielectric layer over the first dielectric layer, wherein the first dielectric layer and the second dielectric layer comprise different materials.

20. The method of claim 15, further comprising planarizing the semiconductor substrate.

* * * * *